(12) United States Patent  
Choi et al.

(10) Patent No.: US 9,543,231 B2
(45) Date of Patent: Jan. 10, 2017

(54) STACKED SEMICONDUCTOR PACKAGE

(71) Applicants: Yun-seok Choi, Hwaseong-si (KR); Hyeok-man Kwon, Suwon-si (KR); Cha-jea Jo, Incheon (KR); Tae-je Cho, Hwaseong-si (KR)

(72) Inventors: Yun-seok Choi, Hwaseong-si (KR); Hyeok-man Kwon, Suwon-si (KR); Cha-jea Jo, Incheon (KR); Tae-je Cho, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 14 days.

(21) Appl. No.: 14/597,183

(22) Filed: Jan. 14, 2015

(65) Prior Publication Data

US 2015/0200154 A1 Jul. 16, 2015

(30) Foreign Application Priority Data

Jan. 14, 2014 (KR) .................. 10-2014-0004705

(51) Int. Cl.
*H01L 25/00* (2006.01)
*H01L 23/48* (2006.01)
(Continued)

(52) U.S. Cl.
CPC ......... *H01L 23/481* (2013.01); *H01L 25/0657* (2013.01); *H01L 23/3128* (2013.01); *H01L 24/05* (2013.01); *H01L 24/06* (2013.01); *H01L 24/16* (2013.01); *H01L 24/17* (2013.01); *H01L 24/32* (2013.01); *H01L 24/73* (2013.01); *H01L 24/92* (2013.01); *H01L 25/0652* (2013.01); *H01L 25/071* (2013.01); *H01L 25/074* (2013.01); *H01L 2224/0401* (2013.01); (Continued)

(58) Field of Classification Search
CPC ... H01L 23/535; H01L 23/538; H01L 23/5386
See application file for complete search history.

(56) References Cited

U.S. PATENT DOCUMENTS 6,376,914 B2 * 4/2002 Kovats ............. H01L 23/49575
257/666
8,059,443 B2 11/2011 Mclaren et al.
(Continued)

FOREIGN PATENT DOCUMENTS

KR 20100011613 A 2/2010

*Primary Examiner* — William Harriston
(74) *Attorney, Agent, or Firm* — Renaissance IP Law Group LLP

(57) ABSTRACT

Provided is a stacked semiconductor package which minimizes a limitation on a design of a lower semiconductor chip due to a characteristic of an upper semiconductor chip stacked on the lower chip. The stacked semiconductor package includes a lower chip having a through electrode area in which a plurality of through electrodes are disposed; and at least one upper chip stacked on the lower chip and having a pad area in which a plurality of pads corresponding to the plurality of through electrodes are disposed. The pad area is disposed along a central axis bisecting an active surface of the upper chip. The central axis where the pad area of the upper chip is disposed is placed at a position which is shifted from a central axis in a longitudinal direction of an active surface of the lower chip.

18 Claims, 26 Drawing Sheets

(51) Int. Cl.
*H01L 25/065* (2006.01)
*H01L 25/07* (2006.01)
*H01L 23/31* (2006.01)
*H01L 23/00* (2006.01)

(52) U.S. Cl.
CPC .............. *H01L 2224/0557* (2013.01); *H01L 2224/05548* (2013.01); *H01L 2224/05553* (2013.01); *H01L 2224/05568* (2013.01); *H01L 2224/06134* (2013.01); *H01L 2224/06136* (2013.01); *H01L 2224/06181* (2013.01); *H01L 2224/16145* (2013.01); *H01L 2224/16225* (2013.01); *H01L 2224/17181* (2013.01); *H01L 2224/32145* (2013.01); *H01L 2224/32225* (2013.01); *H01L 2224/73204* (2013.01); *H01L 2224/92125* (2013.01); *H01L 2225/06513* (2013.01); *H01L 2225/06517* (2013.01); *H01L 2225/06544* (2013.01); *H01L 2225/06562* (2013.01); *H01L 2924/13091* (2013.01); *H01L 2924/1432* (2013.01); *H01L 2924/1434* (2013.01); *H01L 2924/1436* (2013.01); *H01L 2924/15311* (2013.01); *H01L 2924/18161* (2013.01)

(56) References Cited

U.S. PATENT DOCUMENTS

| | | |
|---|---|---|
| 8,242,589 B2 | 8/2012 | Saen et al. |
| 8,343,804 B2 | 1/2013 | Coteus et al. |
| 2007/0023887 A1* | 2/2007 | Matsui ............... H01L 24/73 257/686 |
| 2009/0189293 A1 | 7/2009 | Suzuki et al. |
| 2011/0292742 A1 | 12/2011 | Oh et al. |
| 2012/0051113 A1 | 3/2012 | Choi et al. |
| 2012/0163413 A1 | 6/2012 | Kim et al. |
| 2013/0049223 A1 | 2/2013 | Nomoto et al. |

* cited by examiner

STACKED SEMICONDUCTOR PACKAGE

CROSS-REFERENCE TO RELATED APPLICATIONS

This application claims the benefit of Korean Patent Application No. 10-2014-0004705, filed on Jan. 14, 2014, in the Korean Intellectual Property Office, the disclosure of which is incorporated herein in its entirety by reference.

BACKGROUND

The inventive concepts relates to a stacked semiconductor package, and more particularly, to a semiconductor package in which an upper chip is stacked on a lower chip using a through-silicon via.

As electronic devices become more miniaturized, lighter, and provide increased multi-functional capabilities—in line with the rapid development of the electronics industry and user need, a system on chip implementing a variety of functions in a single semiconductor chip, and a stacked semiconductor package including a plurality of stacked semiconductor chips in a single semiconductor package, are being developed. Also, a semiconductor package in which the system on chip and a different semiconductor chip (e.g., a memory semiconductor chip) are vertically stacked is being developed.

However, all characteristics of semiconductor chips have to be considered to implement a stacked semiconductor package where different types of semiconductor chips are stacked. That is, there may be some limitations in designing a lower semiconductor chip depending on the characteristics of an upper semiconductor chip stacked on the lower semiconductor chip.

SUMMARY

Various embodiments are directed to stacked semiconductor packages.

According to some embodiments, a stacked semiconductor package comprises a lower chip having a through electrode area in which a plurality of through electrodes are disposed, and at least one upper chip stacked on the lower chip and having a pad area in which a plurality of bonding pads corresponding to the plurality of through electrodes are disposed as described in detail below. The through electrode area are arranged along a direction that is transverse to a longitudinal direction of an active surface of the lower chip. The pad area may be disposed along a central axis of the upper chip in a longitudinal direction.

According to some embodiments, a stacked semiconductor package includes a lower chip and at least one upper chip stacked on the lower chip. The lower chip has a through electrode area in which a plurality of through electrodes are disposed. The least one upper chip has a pad area in which a plurality of pads corresponding to the plurality of through electrodes are disposed. The pad area is disposed along a central axis bisecting an active surface of the upper chip, and the central axis where the pad area of the upper chip is disposed is placed at a position which is shifted from a central axis in a longitudinal direction of an active surface of the lower chip.

In some embodiments, the central axis where the pad area of the upper chip is disposed and the central axis in the longitudinal direction of the active surface of the lower chip may cross at a right angle.

In some embodiments, the central axis where the pad area of the upper chip is disposed and the central axis in a transverse direction of the active surface of the lower chip may be aligned on a same line.

In some embodiments, the central axis where the pad area of the upper chip is disposed may be shifted in parallel from the central axis in the transverse direction of the active surface of the lower chip.

In some embodiments, the central axis where the pad area of the upper chip is disposed may be shifted in parallel from the central axis in the longitudinal direction of the active surface of the lower chip.

In some embodiments, a portion of the at least one upper chip may project outward from an edge of the lower chip.

In some embodiments, opposite edges in a longitudinal direction of the active surface of the upper chip may project outward from an edge of the lower chip.

In some embodiments, the pad area may be disposed along a central axis in a longitudinal direction of the active surface of the upper chip.

In some embodiments, the through electrode area of the lower chip may be disposed along a central axis in a transverse direction of the active surface of the lower chip.

In some embodiments, the through electrode area of the lower chip may be disposed to be adjacent to an edge of the active surface of the lower chip.

In some embodiments, the through electrode area of the lower chip may include first and second through electrode areas disposed to be adjacent to opposite edges of the active surface of the lower chip, respectively. Moreover, the at least one upper chip may include two upper chips respectively stacked on the first and second through electrode areas.

In some embodiments, an edge in a transverse direction of the active surface of the at least one upper chip may project outward away from an edge of the lower chip.

In some embodiments, the lower chip may include a function block area arranged apart from the through electrode area, a plurality of function blocks may be disposed in the function block area, the active surface of the lower chip may have a first length in a longitudinal direction and a second length in a transverse direction, the through electrode area may have a first width in the longitudinal direction of the active surface of the lower chip and may extend in a transverse direction of the active surface of the lower chip, and a length of each edge of at least one of the plurality of function blocks may be longer than half a difference between the second length and the first width.

According to further embodiments, a stacked semiconductor package includes a lower chip and at least one upper chip stacked on the lower chip. The lower chip has a through electrode area in which a plurality of through electrodes are disposed and a function block area arranged apart from the through electrode area and in which a plurality of function blocks are disposed. The least one upper chip has a pad area in which a plurality of pads corresponding to the plurality of through electrodes are placed. The pad area is disposed along a central axis bisecting an active surface of the upper chip. An active surface of the lower chip has a first length in a longitudinal direction and a second length in a transverse direction. The through electrode area has a first width in a longitudinal direction of the active surface of the lower chip and extends in a transverse direction of the active surface of the lower chip. A square area having an edge of which the length is longer than half a difference between the second length and the first width is placed in the function block area.

In some embodiments, the second length may be shorter than a difference between the first length and the first width, and a square area having a length equal to or shorter than the second length may be disposed in the function block area.

In some embodiments, the second length may be longer than a difference between the first length and the first width, and a square area having a length equal to or shorter than a difference between the first length and the first width may be disposed in the function block area.

In some embodiments, the through electrode area of the lower chip may include first and second through electrode areas which are separate from each other and disposed to be adjacent to opposite edges of the active surface of the lower chip, respectively. The at least one upper chip may include at least two upper chips respectively stacked on the first and second through electrode areas.

In some embodiments, a value of subtracting two times the first width from the first length may be larger than the second length, and a square area having a length equal to or shorter than the second length may be disposed in the function block area.

In some embodiments, a value of subtracting two times the first width from the first length may be smaller than the second length, and a square area having a length equal to or shorter than a value of subtracting two times the first width from the first length may be disposed in the function block area.

According to further embodiments, a stacked semiconductor package includes a lower chip and an upper chip stacked on the lower chip. The lower chip includes a through electrode area and a function block area. The through electrode area has a first width such that a plurality of through electrodes are disposed, and the through electrode area is disposed along a central axis in a transverse direction of an active surface of the lower chip. The function block area is arranged apart from the through electrode area, and a plurality of function blocks are placed in the function block area. The upper chip includes a pad area disposed along a central axis bisecting an active surface of the upper chip in a longitudinal direction of the active surface of the upper chip and in which a plurality of pads corresponding to the plurality of through electrodes are disposed. The active surface of the lower chip has a first length in a longitudinal direction and a second length in a transverse direction, and a length in the longitudinal direction of the active surface of the upper chip is a third length that is longer than the second length.

In some embodiments, a square area having an edge whose the length is longer than half a difference between the second length and the first width and equal to or shorter than half a difference between the first length and the first width may be placed in the function block area.

In some embodiments, the third length may be shorter than the first length.

According to further embodiments, a stacked semiconductor package includes a package substrate, a lower chip adhered on the package substrate, an upper chip stacked on the lower chip, and a mold layer formed on the package substrate to surround the lower chip and the upper chip. The lower chip includes a through electrode area and a function block area. The through electrode area has a first width in a longitudinal direction of an active surface of the lower chip such that a plurality of through electrodes are disposed. The through electrode area is disposed along a central axis in a transverse direction of the active surface of the lower chip. The function block area is arranged apart from the through electrode area, and a plurality of function blocks are placed in the function block area. The upper chip includes a pad area disposed along a central axis bisecting an active surface of the upper chip in a longitudinal direction of the active surface of the upper chip, and a plurality of pads corresponding to the plurality of through electrodes are disposed in the pad area. The active surface of the lower chip has a first length in a longitudinal direction and a second length in a transverse direction, and at least one of the plurality of function blocks is a main function block in which a length of each edge is longer than half a difference between the second length and the first width.

In some embodiments, the main function block may be a central processing unit or a graphics processing unit.

In some embodiments, a length in a longitudinal direction of the active surface of the upper chip may be a third length that is longer than the second length and shorter than the first length, and a portion of the upper chip may project outward from an edge of the lower chip.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
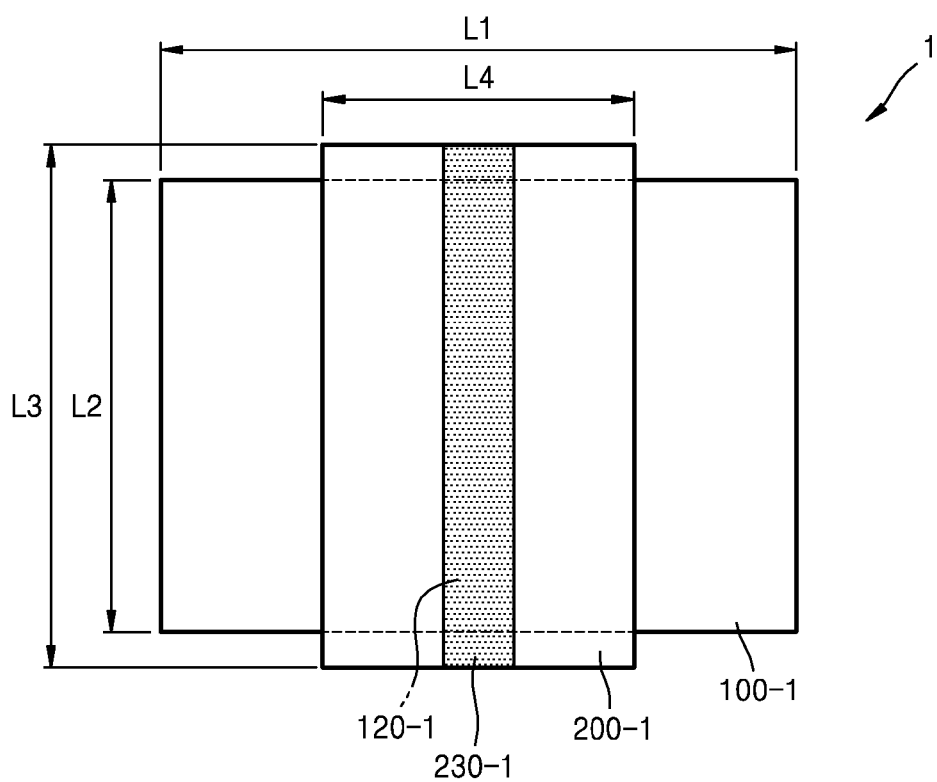
FIGS. 1 to 7 show layouts of semiconductor chips which stacked semiconductor packages according to embodiments of the inventive concepts include.

Various embodiments will now be described more fully hereinafter with reference to the accompanying drawings.

The following embodiments are provided so that this disclosure will be thorough and complete, and will fully convey the scope of the inventive concepts to those skilled in the art. Thus, they may be embodied in different forms and should not be construed as limited to the embodiments set forth herein. Further, in the drawing figures, the dimensions of layers and regions may be exaggerated for clarity of illustration.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. Like reference numerals or like reference designators refer to like elements throughout the specification.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the inventive concepts.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit the inventive concepts. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the inventive concepts may be described with reference to cross-sectional illustrations, which are schematic illustrations of idealized embodiments of the inventive concepts. As such, variations from the shapes of the illustrations, as a result, for example, of manufacturing techniques and/or tolerances, are to be expected. Thus, embodiments of the inventive concepts should not be construed as limited to the particular shapes of regions illustrated herein, but are to include deviations in shapes that result from, e.g., manufacturing. The inventive concepts may be realized using only one of the embodiments or a combination of at least two of the embodiments. Unless otherwise defined, all terms (including technical and scientific terms) used herein have the same meaning as commonly understood by one of ordinary skill in the art to which example embodiments belong.

As used herein, the term "and/or" includes any and all combinations of one or more of the associated listed items. In addition, expressions such as "at least one of," when preceding a list of elements, modify the entire list of elements and do not modify the individual elements of the list.

Below, the inventive concepts are more fully described by describing an embodiment of the inventive concepts with reference to accompanying drawings.

FIGS. 1 to 7 show layouts of semiconductor chips to be included in stacked semiconductor packages according to some embodiments of the inventive concepts. Regarding FIGS. 2 to 7, descriptions already made with respect to FIG. 1 are omitted.

In particular, as shown in FIG. 1, a stacked semiconductor package 1 may include a first semiconductor chip 100-1 and a second semiconductor chip 200-1. The second semiconductor chip 200-1 is stacked on the first semiconductor chip 100-1. The first semiconductor chip 100-1 and the second semiconductor chip 200-1 are referred to as a lower chip 100-1 and an upper chip 200-1, respectively, hereinbelow.

The lower chip 100-1 may have a through electrode area 120-1 where a plurality of through electrodes (not shown) are disposed. The upper chip 200-1 may have a pad area 230-1 where a plurality of pads (not shown) corresponding to the plurality of through electrodes are disposed. A portion of the through electrode area 120-1 where the plurality of through electrodes are formed and a portion of the pad area 230-1 where the plurality of pads are formed may overlap each other. For example, the plurality of through electrodes and the plurality of pads may be disposed at a portion where the through electrode area 120-1 and the pad area 230-1 overlap. The pad area 230-1 may be formed along a central axis that bisects an active surface of the upper chip 200-1.

Hereinbelow, except where noted, the central axis of a semiconductor chip may mean a central axis that bisects an active surface of a semiconductor chip. That is, the central axis of the active surface of the semiconductor chip may be a central axis perpendicular to the active surface of the semiconductor chip or a central axis extending along the active surface. Except where noted, the central axis of the active surface of the semiconductor chip may be the central axis extending along the active surface. The central axis of the semiconductor chip, for example, may be a central axis in a longitudinal direction of the active surface of the semiconductor chip or a central axis in a transverse direction thereof. Also, except where noted, the longitudinal direction and the transverse direction may mean a longitudinal direction and a transverse direction of the active surface, respectively. In the present disclosure, the words "a longitudinal direction" can be interchangeably used with "a lengthwise direction."

Each of a through electrode area and a pad area may be an area for separation of the whole semiconductor chip. The "active surface" may simply be a reference as a location, in that the through electrode area and the pad area are disposed along a central axis bisecting the active surface. This may mean that locations of the through electrode area and the pad area are not limited only by the active surface of the semiconductor chip. For example, each of the through electrode area and the pad area may be an area with a thickness ranging from the active surface to a non-active surface.

A portion of a scribe lane area, which remains when semiconductor chips are separated from each other from a wafer including the semiconductor chips, may remain at an edge of an actually manufactured semiconductor chip. The scribe lane area may be removed in a dicing saw process for singulating individual semiconductor chips, but a remaining portion may exist. In the inventive concepts, except where noted, the edge of the semiconductor chip may mean an edge of a valid area of an individual semiconductor chip other than a remaining scribe lane area.

The lower chip 100-1 may have a substantially rectangular shape. The active surface of the lower chip 100-1 may have a first length L1 in a longitudinal direction and a second length L2 in a transverse direction. The second length may be shorter than the first length L1.

For reference, in FIGS. 1 to 7, the first length L1 and the second length L2 may be marked by the same reference numerals for relative size comparison between the first length L1 and the second length L2, but the first length L1 and the second length L2 in FIGS. 1 to 7 may not have the same values.

In some embodiments, the pad area 230-1 of the upper chip 200-1 may extend in a direction different from a longitudinal central axis of the active surface of the lower chip 100-1.

A central axis where the pad area 230-1 of the upper chip 200-1 is located may be disposed such that it is shifted from a central axis in a longitudinal direction of the lower chip 100-1. In this case, the central axis of the lower chip 100-1 in a longitudinal direction may be referred to as a longitudinal central axis.

The through electrode area 120-1 of the lower chip 100-1 may be formed along the central axis in the transverse direction ("transverse central axis") bisecting the active surface of the lower chip 100-1.

A central axis where the pad area 230-1 of the upper chip 200-1 is located may be at a position after rotation from the longitudinal central axis of the active surface of the lower chip 100-1. For example, the central axis where the pad area 230-1 of the upper chip 200-1 is located may be arranged about 90 degrees from the longitudinal central axis of the active surface of the lower chip 100-1. That is, the central axis where the pad area 230-1 of the upper chip 200-1 is located and the longitudinal central axis of the active surface of the lower chip 100-1 may intersect each other. For example, the central axis where the pad area 230-1 of the upper chip 200-1 is located and the longitudinal central axis of the active surface of the lower chip 100-1 may cross at right angles.

In some embodiments, the longitudinal central axis of the upper chip 200-1 and the longitudinal central axis of the active surface of the lower chip may intersect each other. For example, the longitudinal central axis of the upper chip 200-1 and the longitudinal central axis of the active surface of the lower chip 100-1 may intersect each other at approximately right angles.

In some embodiments, the longitudinal central axis of the upper chip 200-1 may be disposed along the same direction as a transverse central axis of the active surface of the lower chip 100-1.

The upper chip 200-1 may be stacked on the lower chip 100-1 such that the pad area 230-1 of the upper chip 200-1 is disposed along the transverse direction of the lower chip 100-1. As seen from above, the through electrode area 120-1 of the lower chip 100-1 and the pad area 230-1 of the upper chip 200-1 may extend along the same direction and may overlap. That is, the central axis where the pad area 230-1 of the upper chip 200-1 is located and the central axis in the longitudinal direction of the active surface of the lower chip 100-1 may be aligned on the same line. Thus, the plurality of through electrodes of the through electrode area 120-1 of the lower chip 100-1 may correspond to the plurality of pads of the pad area 230-1 of the upper chip 200-1, respectively.

The pad area 230-1 of the upper chip 200-1 may be formed along the central axis in the longitudinal direction of the active surface of the upper chip 200-1. However, the inventive concepts are not limited thereto. For example, the pad area 230-1 of the upper chip 200-1 may be formed along the central axis in the transverse direction of the active surface of the upper chip 200-1.

The active surface of the upper chip 200-1 may have a rectangular shape. The active surface of the upper chip 200-1 may have a third length L3 in the longitudinal direction and a fourth length L4, shorter than the third length L3, in the transverse direction. The third length L3, as a length in the longitudinal direction of the active surface of the upper chip 200-1, may be longer than the second length L2, as a length in the transverse direction of the active surface of the lower chip 100-1.

The third length L3, as a length in the longitudinal direction of the active surface of the upper chip 200-1 may be shorter than the first length L1, which is a length in the longitudinal direction of the active surface of the lower chip 100-1. The fourth length L4, as a length in the transverse direction of the active surface of the upper chip 200-1, may be shorter than the second length L2, which is a length in the transverse direction of the active surface of the lower chip 100-1. However, the inventive concepts are not limited thereto.

A portion of the upper chip 200-1 may project outward from an edge of the lower chip 100-1. For example, if the third length L3 is longer than the second length L2 and the pad area 230-1 of the upper chip 200-1 is formed along the central axis in the longitudinal direction of the active surface of the upper chip 200-1, opposite edges on longitudinal sides of the active surface of the upper chip 200-1 may project outward from respective edges of the lower chip 100-1.

As will be described later, the remaining area of the lower chip 100-1 other than the through electrode area 120-1 may be a function block area. A plurality of function blocks may be disposed in the function block area. For example, the lower chip 100-1 may be a System-on-Chip (SoC) in which a function block such as a central processing unit (CPU) or a graphics processing unit (GPU) is disposed in the function block area. The lower chip 100-1 may be, for example, a SoC such as an Application Processor (AP). All or some function blocks which are disposed in the lower chip 100-1 may be disposed in the function block area. In other exemplary embodiments, some function blocks or a part of some function blocks may be disposed in a portion of the through electrode area 120-1 where a through electrode is not formed.

The upper chip 200-1 may be, for example, a semiconductor memory chip. The upper chip 200-1, for example, may be a volatile semiconductor memory device such as Dynamic Random Access Memory (DRAM) or Static Random Access Memory (SRAM) or a non-volatile semiconductor memory device such as Phase-change Random Access Memory (PRAM), Magnetoresistive Random Access Memory (MRAM), Ferroelectric Random Access Memory (FeRAM), or Resistive Random Access Memory (RRAM).

Therefore, the stacked package according to some embodiments may have the lower chip 100-1 including a microprocessor and the upper chip 200-1 including a memory device described above.

Figure 2:
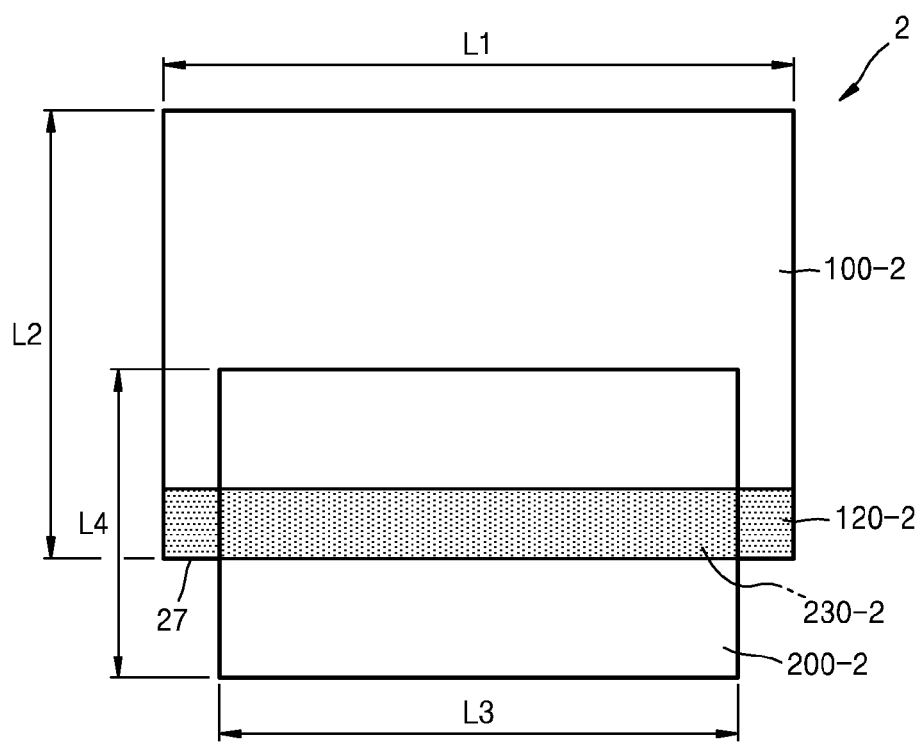

Referring to FIG. 2, a stacked semiconductor package 2 includes an upper chip 200-2 stacked on a lower chip 100-2.

The lower chip 100-2 may have a through electrode area 120-2 where a plurality of through electrodes (not shown)

are disposed. The upper chip 200-2 may have a pad area 230-2 where a plurality of pads (not shown) corresponding to the plurality of through electrodes are disposed. A portion of the through electrode area 120-2 where the plurality of through electrodes are formed and a portion of the pad area 230-2 where the plurality of pads are formed may overlap each other.

A central axis where a pad area 230-2 of the upper chip 200-2 is located may be disposed such that it is shifted from a central axis in a longitudinal direction of the lower chip 100-2. A central axis where the pad area 230-2 of the upper chip 200-2 is located may be disposed such that it is offset in parallel from a central axis in a longitudinal direction of the active surface of the lower chip 100-2. For example, the central axis where the pad area 230-2 of the upper chip 200-2 is located may be disposed such that it is shifted in parallel from the central axis in the longitudinal direction of an active surface of the lower chip 100-2. The central axis where the pad area 230-2 of the upper chip 200-2 is located may be adjacent to an edge 27 on a transverse side of the active surface of the lower chip 100-2.

The through electrode area 120-2 of the lower chip 100-2 may be adjacent to the edge 27 of the active surface of the lower chip 100-2. For example, the through electrode area 120-2 of the lower chip 100-2 may be adjacent to the edge 27 of the active surface of the lower chip 100-2. The upper chip 200-2 may be stacked on the lower chip 100-2 such that the pad area 230-2 of the upper chip 200-2 is disposed along the longitudinal direction of the lower chip 100-2. In some embodiments, the pad area 230-2 of the upper chip 200-2 may be disposed along a central axis of the upper chip 200-2 in a longitudinal direction. As seen from above, the through electrode area 120-2 of the lower chip 100-2 and the pad area 230-2 of the upper chip 200-2 may overlap along the same direction. That is, the central axis where the pad area 230-2 of the upper chip 200-2 is located may be aligned adjacent in parallel to the edge 27 on the transverse side of the active surface of the lower chip 100-2. Thus, the plurality of through electrodes of the through electrode area 120-2 of the lower chip 100-2 may correspond to the plurality of pads of the pad area 230-2 of the upper chip 200-2.

A third length L3, as a length in the longitudinal direction of the active surface of the upper chip 200-2, may be shorter than a first length L1, which is a length in the longitudinal direction of the active surface of the lower chip 100-2. However, the inventive concepts are not limited thereto.

A portion of the upper chip 200-2 may project outward from the edge 27 of the lower chip 100-2. If the first length L1 is longer than the third length L3 and the pad area 230-2 of the upper chip 200-2 is formed along the central axis in the longitudinal direction of the active surface of the upper chip 200-2, for example, an edge region on a transverse side of the active surface of the upper chip 200-2 may project outward from the edge 27 of the lower chip 100-2. Also, a portion of the edge region on a longitudinal side of the active surface of the upper chip 200-2 may be adjacent to the edge region, projecting outward from the edge 27 of the lower chip 100-2, in the transverse direction of the active surface of the upper chip 200-2 and may project outward from (extend beyond) the edge 27 of the lower chip 100-2. Another edge region on the transverse side of the active surface of the upper chip 200-2 may be opposite to the projected edge region and may be disposed on the inner side of the edge 27 of the lower chip 100-2, that is, the active surface of the lower chip 100-2.

Figure 3:
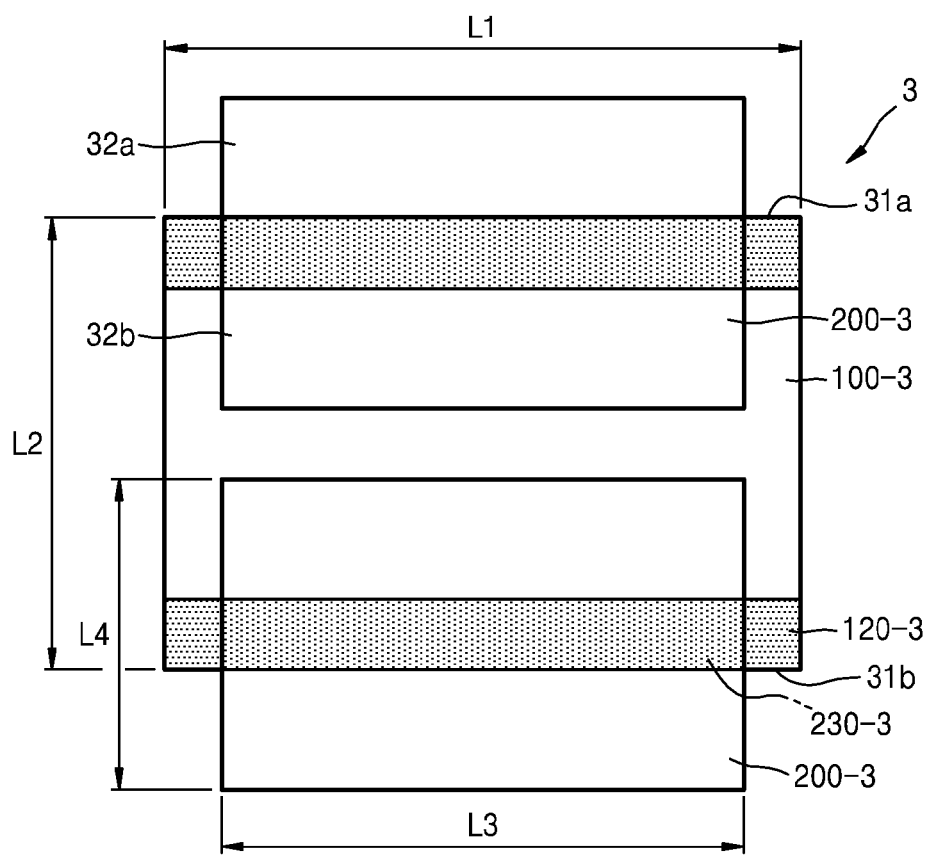

Referring to FIG. 3, a stacked semiconductor package 3 includes a lower chip 100-3 and a plurality of upper chips 200-3 respectively stacked on the lower chip 100-3.

The lower chip 100-3 may have a plurality of through electrode areas 120-3 where a plurality of through electrodes are disposed. The plurality of through electrode areas 120-3 may be separately formed in the lower chip 100-3. For example, the lower chip 100-3 may have two opposite through electrode areas 120-3 that may be disposed adjacent to opposite edges of an active surface of the lower chip 100-3, on a transverse side, respectively.

Each of the upper chips 200-3 may have a pad area 230-3. In the pad area 230-3, a plurality of pads (not shown) are respectively disposed corresponding to the plurality of through electrodes formed in a corresponding through electrode area 120-3 of the lower chip 100-3. Therefore, at least a portion of one through electrode area 120-3 may overlap with a portion of the pad area 230-3 of a corresponding upper chip 200-3.

For example, two upper chips 200-3 may be stacked on the lower chip 100-3. That is, the two upper chips 200-3 may be stacked on the two through electrode areas 120-3 of the lower chip 100-3, respectively.

A central axis where the pad area 230-3 of each of the upper chips 200-3 is located may be disposed such that it is shifted (offset) from a central axis in a longitudinal direction of the lower chip 100-3 ("a longitudinal central axis"). The central axis where the pad area 230-3 of each of the upper chips 200-3 is located may be disposed such that it is shifted (offset) in parallel from the longitudinal central axis of the lower chip 100-3. Thus, the central axis where the pad area 230-3 of each of the two upper chips 200-3 is located may be adjacent to a respective one of opposite edges 31a, 31b on a transverse side of the active surface of the lower chip 100-3.

The through electrode areas 120-3 of the lower chip 100-3 may be adjacent to the edges 31a, 31b of the active surface of the lower chip 100-3. For example, the two through electrode areas 120-3 of the lower chip 100-3 may be adjacent to a respective one of opposite edges 31a, 31b of the active surface of the lower chip 100-3. The two upper chips 200-3 may be respectively stacked on the lower chip 100-3 such that the pad areas 230-3 of the two upper chips 200-3 are disposed along the longitudinal direction of the lower chip 100-3. As discussed above, one of the plurality of through electrode areas 120-3 of the lower chip 100-3 and a corresponding one of the pad areas 230-3 of the plurality of upper chips 200-3 may overlap along the same direction. That is, the central axis where one of the pad areas 230-3 of the upper chips 200-3 is located may be adjacent in parallel to one edge, e.g., 31b, of the active surface of the lower chip 100-3. For example, the plurality of through electrodes of the two through electrode areas 120-3 of the lower chip 100-3 may correspond to the plurality of pads of the pad areas 230-3 of the two upper chips 200-3, respectively.

A third length L3, as a length in the longitudinal direction of the active surface of the upper chip 200-3, may be shorter than a first length L1 that is a length in the longitudinal direction of the active surface of the lower chip 100-3. However, the inventive concepts are not limited thereto.

In some embodiments, a portion of each of the upper chips 200-3 may project outward from (or extend beyond) a respective edge of the lower chip 100-3. For example, if the first length L1 is longer than the third length L3, and the pad area 230-3 of the upper chip 200-3 is formed along the central axis in the longitudinal direction of the active surface of the upper chip 200-3, one edge region 32a on a transverse side of the active surface of each upper chip 200-3 may project outward from (or extend beyond) the edge 31*a* of the lower chip 100-3. Another edge region 32*b* on the transverse side of the active surface of the upper chip 200-3 may be opposite to the edge region 32*a* which projects outward from (or extending beyond) the edge 31*a* of the lower chip 100-3 in the transverse direction of the active surface of each upper chip 200-3, and may be disposed on the active surface of the lower chip 100-3.

For example, portions of opposing edge regions on the transverse side of the active surface of each of the two upper chips 200-3 may be disposed on the active surface of the lower chip 100-3, and the other opposite portions thereof may be disposed outside of the edges 31*a*, 31*b* of the lower chip 100-3.

Figure 4:
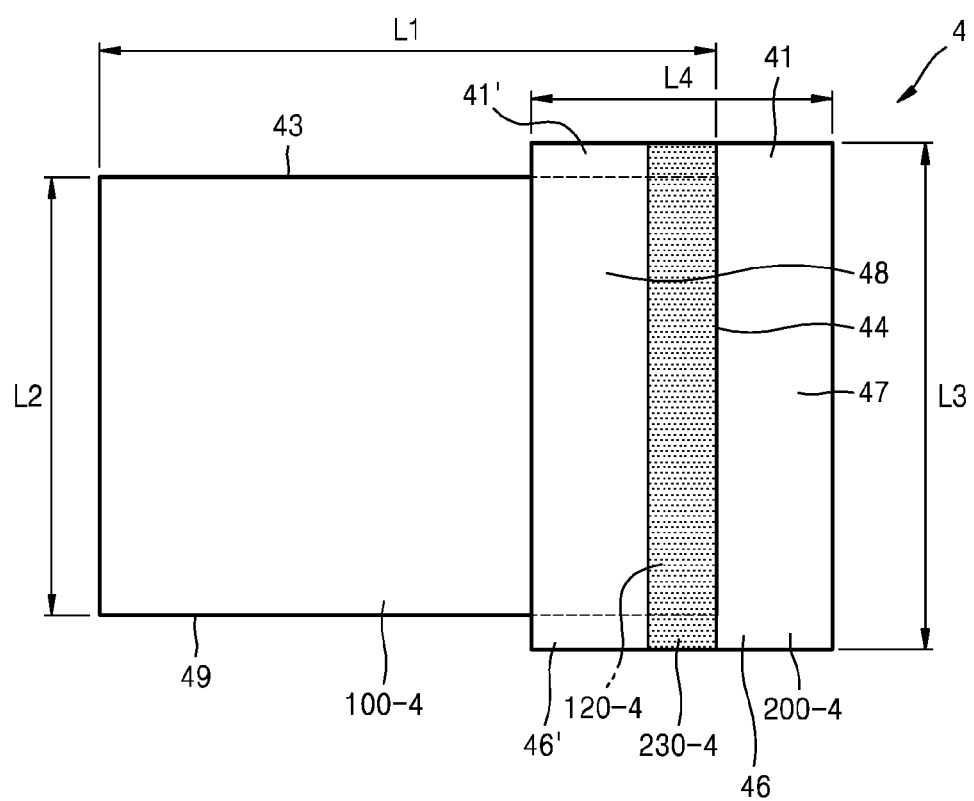

Referring to FIG. 4, a stacked semiconductor package 4 may include a lower chip 100-4 and an upper chip 200-4 stacked on the lower chip 100-4.

The lower chip 100-4 may have a through electrode area 120-4 where a plurality of through electrodes (not shown) are disposed. The upper chip 200-4 may have a pad area 230-4 where a plurality of pads (not shown) corresponding to the plurality of through electrodes are disposed. A portion of the through electrode area 120-4 and a portion of the pad area 230-4 may overlap each other.

A central axis where the pad area 230-4 of the upper chip 200-4 is located may be disposed such that it is shifted from a central axis in a longitudinal direction of the lower chip 100-4. For example, a central axis where the pad area 230-4 of the upper chip 200-4 is located may be disposed such that it is rotated 90 degree and shifted in parallel from a central axis in a longitudinal direction of an active surface of the lower chip 100-4. Alternatively, the central axis where the pad area 230-4 of the upper chip 200-4 is located may be disposed such that it is shifted in parallel from a central axis in a transverse direction of the active surface of the lower chip 100-4. For example, the central axis where the pad area 230-4 of the upper chip 200-4 is located may be disposed such that it is rotated and shifted in parallel from the central axis in the longitudinal direction of the active surface of the lower chip 100-4. In other words, the central axis where the pad area 230-4 of the upper chip 200-4 is located is shifted in parallel from the central axis in the transverse direction. Thus, the central axis where the pad area 230-4 of the upper chip 200-4 is located may be adjacent to an edge 44 on a longitudinal side of the active surface of the lower chip 100-4.

The through electrode area 120-4 of the lower chip 100-4 may be adjacent to the edge 44 of the active surface of the lower chip 100-4. For example, the through electrode area 120-4 of the lower chip 100-4 may be adjacent to the edge 44 of the lower chip 100-4, which is parallel to the transverse direction of the active surface of the lower chip 100-4. The upper chip 200-4 may be stacked on the lower chip 100-4 such that the pad area 230-4 of the upper chip 200-4 is disposed along the transverse direction of the lower chip 100-4. As seen from above, the through electrode area 120-4 of the lower chip 100-4 and the pad area 230-4 of the upper chip 200-4 may overlap along the same direction. That is, the central axis where the pad area 230-4 of the upper chip 200-4 is located may be adjacent in parallel to the edge 44 of the active surface of the lower chip 100-4. Thus, the plurality of through electrodes of the through electrode area 120-4 of the lower chip 100-4 may correspond to the plurality of pads of the pad area 230-4 of the upper chip 200-4, respectively.

A third length L3, as a length in the longitudinal direction of the active surface of the upper chip 200-4, may be shorter than a first length L1, which is a length in the longitudinal direction of the active surface of the lower chip 100-4, and may be longer than a second length L2, which is a length in the transverse direction thereof. However, the inventive concepts are not limited thereto.

A portion of the upper chip 200-4 may project outward from an edge of the lower chip 100-4. That is, an edge region 47 on a transverse side of the active surface of the upper chip 200-4 may project outward from the edge 44 of the lower chip 100-4. A portion or an entire portion of another edge region 48 of the upper chip 200-4 opposite to the projected edge region 47 may be disposed on the active surface of the lower chip 100-4.

For example, if the third length L3 is longer than the second length L2, edge regions 41, 46 on longitudinal sides of the active surface of the upper chip 200-4 may adjoin the edge region 47 of the active surface of the upper chip 200-4 and may project outward from the edges 43, 49 of the lower chip 100-4. Also, portions 41', 46' of another edge region on the transverse side of the active surface of the upper chip 200-4 opposite to the edge regions 41, 46 may project outward from the edges 43, 49 of the lower chip 100-4.

Figure 29:
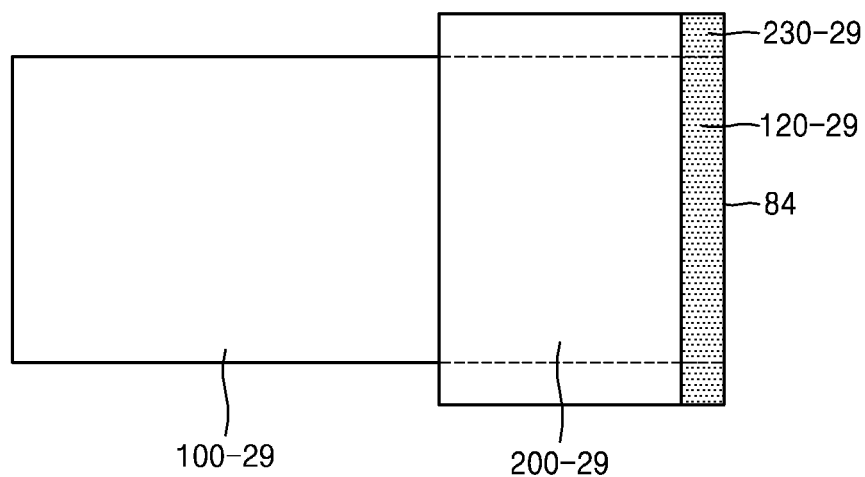
FIG. 29 shows a layout of semiconductor chips which stacked semiconductor packages according to some embodiments of the inventive concepts include.

In some other embodiments, as shown in FIG. 29, a pad area 230-29 of an upper chip 200-29 corresponding to a through electrode area 120-29 of a lower chip 100-29 may be adjacent to an edge 84 of an active surface of the lower chip 100-29 on a transverse side. Alternatively, although not illustrated, the pad area 230-29 may be closer to the edge 84 than to a longitudinal central axis of the upper chip 200-29, but the pad area 230-29 can be somewhat spaced apart from the edge 84. Such aspects of the present disclosure discussed in connection with FIG. 29 may be applied to other embodiments of the present disclosure.

Figure 5:
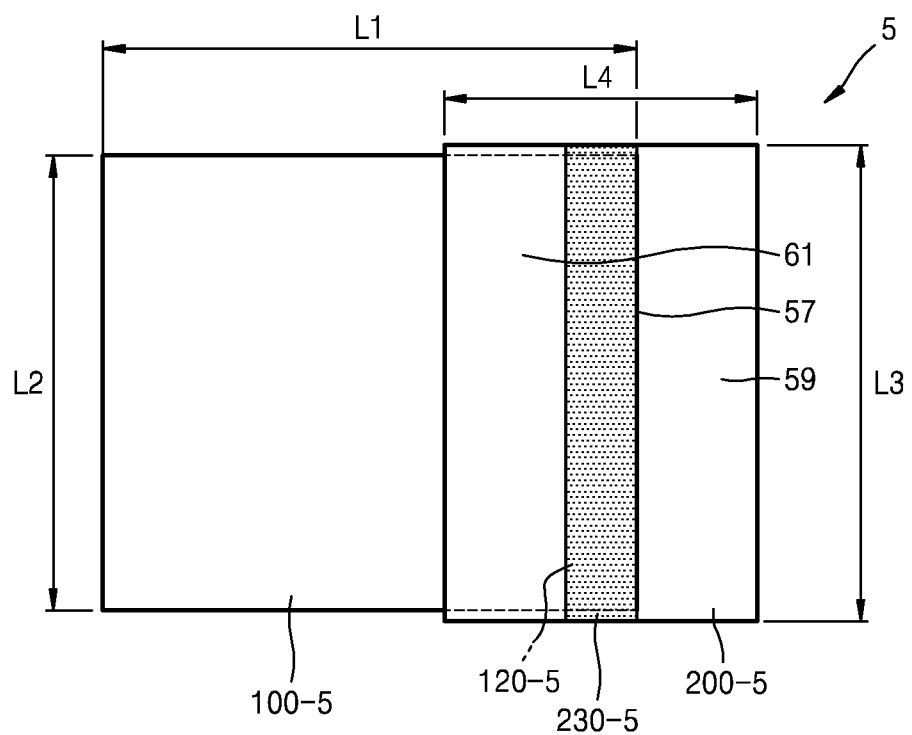

Referring to FIG. 5, a stacked semiconductor package 5 includes a lower chip 100-5 and an upper chip 200-5 stacked on the lower chip 100-5. The stacked semiconductor package 5 shown in FIG. 5 may be the same as the stacked semiconductor package 4 shown in FIG. 4 except that a ratio of a length in a longitudinal direction to a length in a transverse direction of the lower chip 100-5 and/or the upper chip 200-5 is different from a ratio of a length in a longitudinal direction to a length in a transverse direction of the lower chip 100-4 and/or the upper chip 200-4, and a detailed description thereof is thus omitted.

Although not shown in the figures, for example, if a third length L3 is shorter than a second length L2, portions of an edge region on a longitudinal side of an active surface of the upper chip 200-5 may project outward from an edge 57 of the lower chip 100-5. Here, the edge region on the longitudinal side of the active surface of the upper chip 200-5 may adjoin an edge region 59 which projects outward from the edge 57 of the lower chip 100-5, in a transverse direction of an active surface of the upper chip 200-5. Another edge region 61 on the transverse side of the active surface of the upper chip 200-5 may be opposite to the edge region 59 of the active surface of the upper chip 200-5 which projects outward from the edge 57 of the lower chip 100-5 in the transverse direction and may be disposed on the active surface of the lower chip 100-5.

Figure 6:
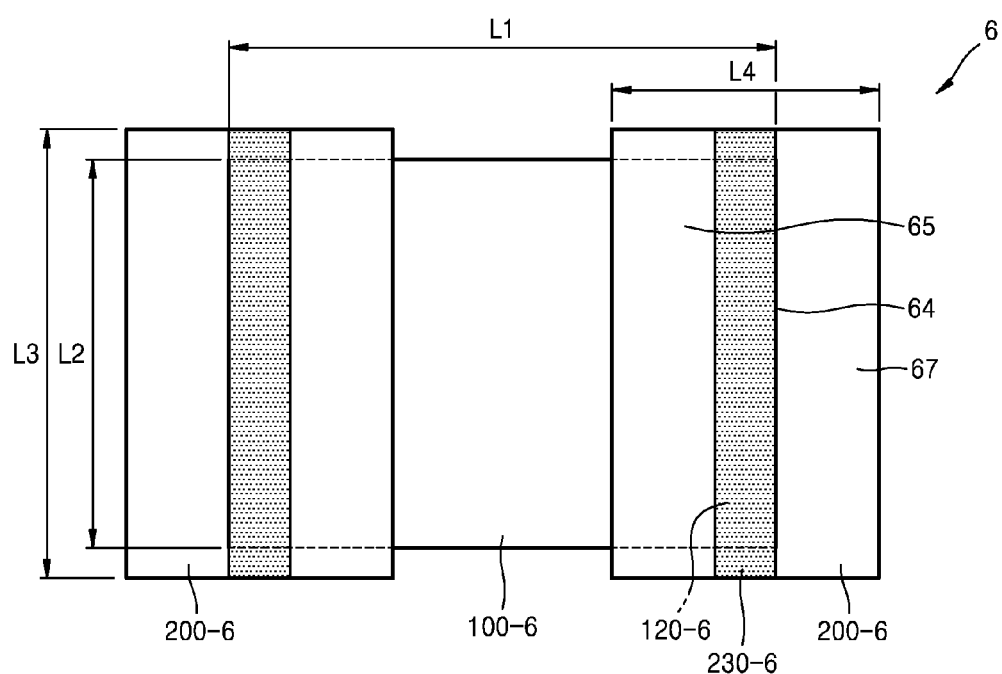

Referring to FIG. 6, a stacked semiconductor package 6 includes a lower chip 100-6 and a plurality of upper chips 200-6 stacked on the lower chip 100-6.

The lower chip 100-6 may have a plurality of through electrode areas 120-6 where a plurality of through electrodes are disposed. The plurality of through electrode areas 120-6 may be separately formed in the lower chip 100-6. For example, the lower chip 100-6 may have two through electrode areas 120-6 that may be adjacent to opposite edges of an active surface of the lower chip 100-6, respectively.

Each of the upper chips 200-6 may have a pad area 230-6 including a plurality of pads (not shown) disposed corresponding to the plurality of through electrodes formed in a corresponding through electrode area 120-6 of the lower chip 100-6. A portion of one through electrode area 120-6 may overlap with a portion of the pad area 230-6 of a corresponding upper chip 200-6.

For example, two upper chips 200-6 may be stacked on the lower chip 100-6. That is, the two upper chips 200-6 may be stacked on the two through electrode areas 120-6 of the lower chip 100-6, respectively.

A central axis where the pad area 230-6 of each of the upper chips 200-6 is located may be disposed such that it is shifted from a central axis in a longitudinal direction of the lower chip 100-6. The central axis of the pad area 230-6 of each of the upper chips 200-6 may be disposed such that it is rotated and shifted in parallel from the central axis in the longitudinal direction of the active surface of the lower chip 100-6. Alternatively, the central axis of the pad area 230-6 of each of the upper chips 200-6 may be disposed such that it is shifted in parallel from the central axis in a transverse direction of the active surface of the lower chip 100-6. For example, each central axis of the pad area 230-6 of each of the two upper chips 200-6 may be disposed such that it is rotated 90 degree and shifted in parallel from the central axis in the longitudinal direction of the active surface of the lower chip 100-6. Thus, the central axis of the pad area 230-6 of each of the two upper chips 200-6 may be adjacent to opposite edges on the longitudinal sides of the active surface of the lower chip 100-6, respectively.

The through electrode area 120-6 of the lower chip 100-6 may be adjacent to the edge of the active surface of the lower chip 100-6. For example, the two through electrode areas 120-6 of the lower chip 100-6 may be adjacent to opposite edges on the longitudinal sides of the active surface of the lower chip 100-6. The two upper chips 200-6 may be stacked on the lower chip 100-6 such that the pad areas 230-6 of the two upper chips 200-6 are disposed along the transverse direction of the lower chip 100-6. As seen from above, one of the two through electrode areas 120-6 of the lower chip 100-6 and a corresponding one of the pad areas 230-6 of the plurality of upper chips 200-6 may overlap along the same direction. That is, the central axis of one of the pad areas 230-6 of the upper chips 200-6 may be adjacent in parallel to one edge on the longitudinal side of the active surface of the lower chip 100-6. For example, the plurality of through electrodes of the two through electrode areas 120-6 of the lower chip 100-6 may correspond to the plurality of pads of the pad areas 230-6 of the two upper chips 200-6, respectively.

A third length L3, as a length in the longitudinal direction of the active surface of the upper chip 200-6, may be shorter than a first length L1 that is a length in the longitudinal direction of the active surface of the lower chip 100-6 and may be longer than a second length L2 as a length in the transverse direction thereof. However, the inventive concepts are not limited thereto.

A portion of each of the upper chips 200-6 may project outward from an edge of the lower chip 100-6. That is, an outer edge region 67 of each upper chip 200-6 on a transverse side thereof may project outward from an edge 64 of the lower chip 100-6. A portion or an entire portion of an inner edge region 65 of each upper chip 200-6 opposite to the projected edge region 67 may be disposed on the active surface of the lower chip 100-6.

Also, two opposite edges of each upper chip 200-6 on longitudinal sides thereof may project outward from two opposite edges of the lower chip 100-6 on the transverse sides thereof, respectively.

In some embodiments, an inner edge region 65 on a transverse side of the active surface of each of the two upper chips 200-6 may be disposed on the active surface of the lower chip 100-6, and the outer edge region 67 thereof opposite to the inner edge region 65 may be disposed outside of the edge 64 of the lower chip 100-6.

Figure 7:
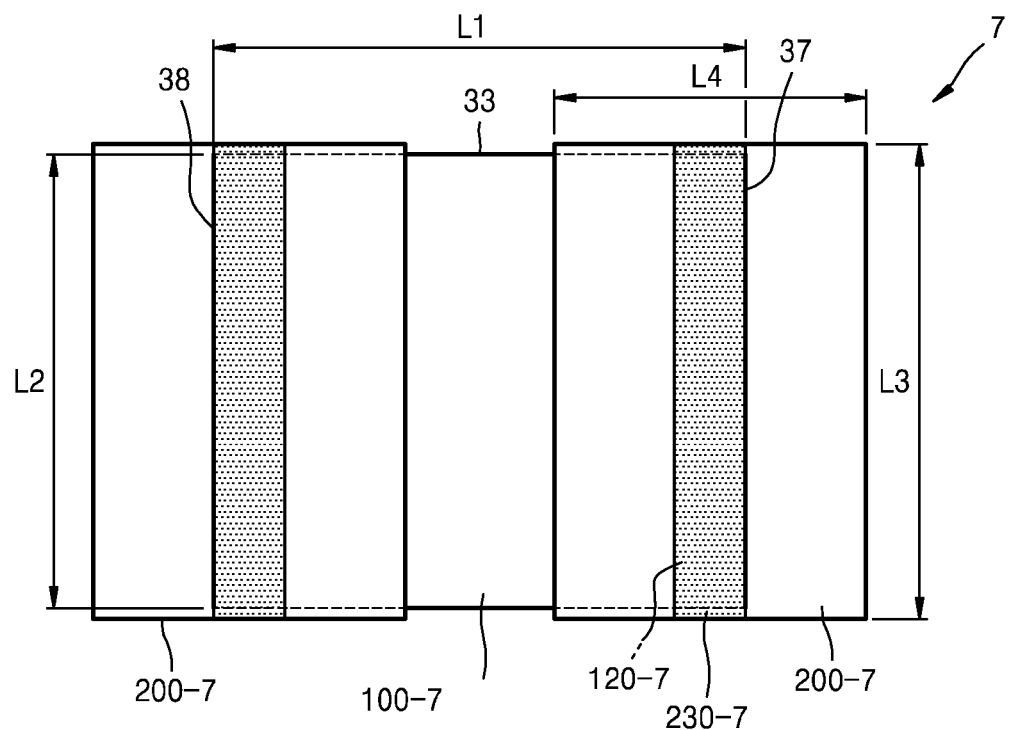

Referring to FIG. 7, a stacked semiconductor package 7 includes a lower chip 100-7 and an upper chip 200-7 stacked on the lower chip 100-7. The stacked semiconductor package 7 shown in FIG. 7 may be the same as the stacked semiconductor package 6 shown in FIG. 6 except that a ratio of a length in a longitudinal direction to a length in a transverse direction of the lower chip 100-7 and/or the upper chip 200-7 is different from a ratio of a length in a longitudinal direction to a length in a transverse direction of the lower chip 100-6 and/or the upper chip 200-6, and a detailed description thereof is thus omitted.

Each of the upper chips 200-7 may have a pad area 230-7 including a plurality of pads (not shown) disposed corresponding to the plurality of through electrodes formed in a corresponding through electrode area 120-7 of the lower chip 100-7. A portion of one through electrode area 120-7 may overlap with a portion of the pad area 230-7 of a corresponding upper chip 200-7.

Although not shown in the figures, for example, if a third length L3 is shorter than a second length L2, portions of an edge region on a longitudinal side of an active surface of the upper chip 200-7 may project outward from an edge 33 of the lower chip 100-7. Here, the edge region on the longitudinal side of the active surface of the upper chip 200-7 may adjoin an edge region which projects outward from another edge 37 of the lower chip 100-7 on a transverse side of an active surface of the upper chip 200-7.

Opposing edge regions on the transverse sides of the active surfaces of the two upper chips 200-7 may be disposed on the active surface of the lower chip 100-7, and the other portions thereof may be disposed outside of (or beyond) the edge 37, 38 of the lower chip 100-7, respectively.

In the embodiments described in connection with FIGS. 1 to 7, one upper chip 200-$i$ ($i$=1 to 7) is vertically stacked on a lower chip 100-$i$. However, the inventive concepts are not limited thereto. For example, one upper chip 200-$i$ may be a stack of a plurality of semiconductor memory chips. Here, the stack may mean all memory chips in a memory system in one assembly (JEDEC Standard Definition). Each of the upper chips 200-1 to 200-7 shown in FIGS. 1 to 7 may be formed of a plurality of slices. Here, a slice may mean one memory chip in the stack of memory chips (JEDEC Standard Definition). This will be more fully described with reference to FIG. 13.

Figure 8:
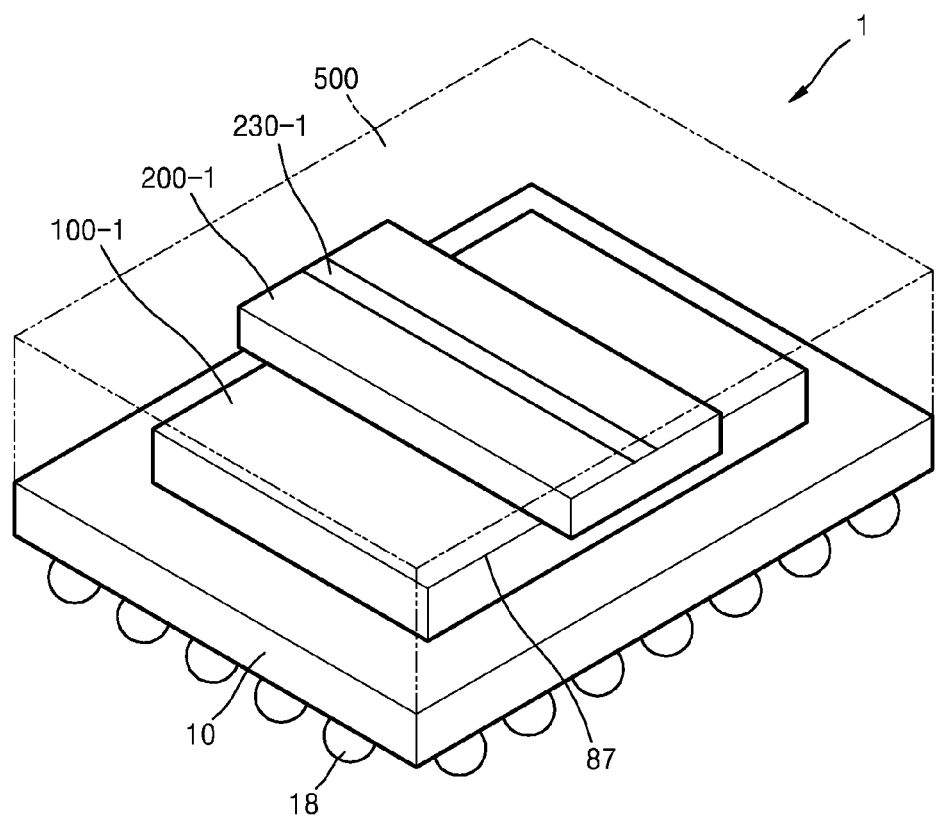
FIGS. 8 to 13 are schematic perspective views illustrating stacked semiconductor packages according to embodiments of the inventive concepts.
Figure 9:
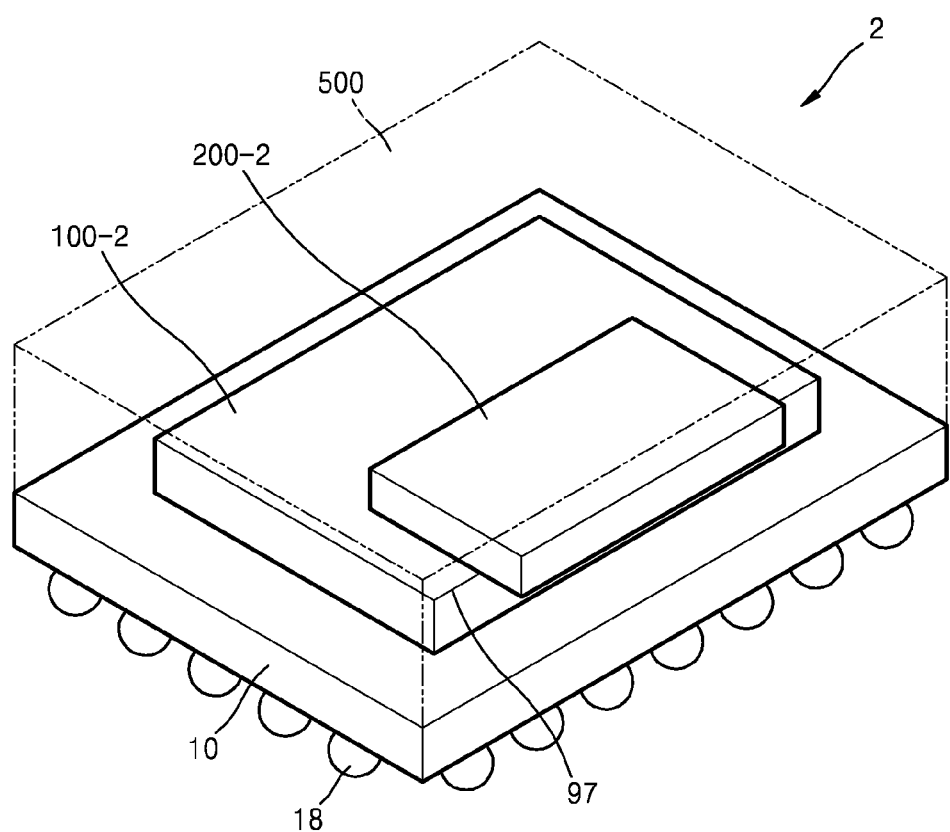
Figure 10:
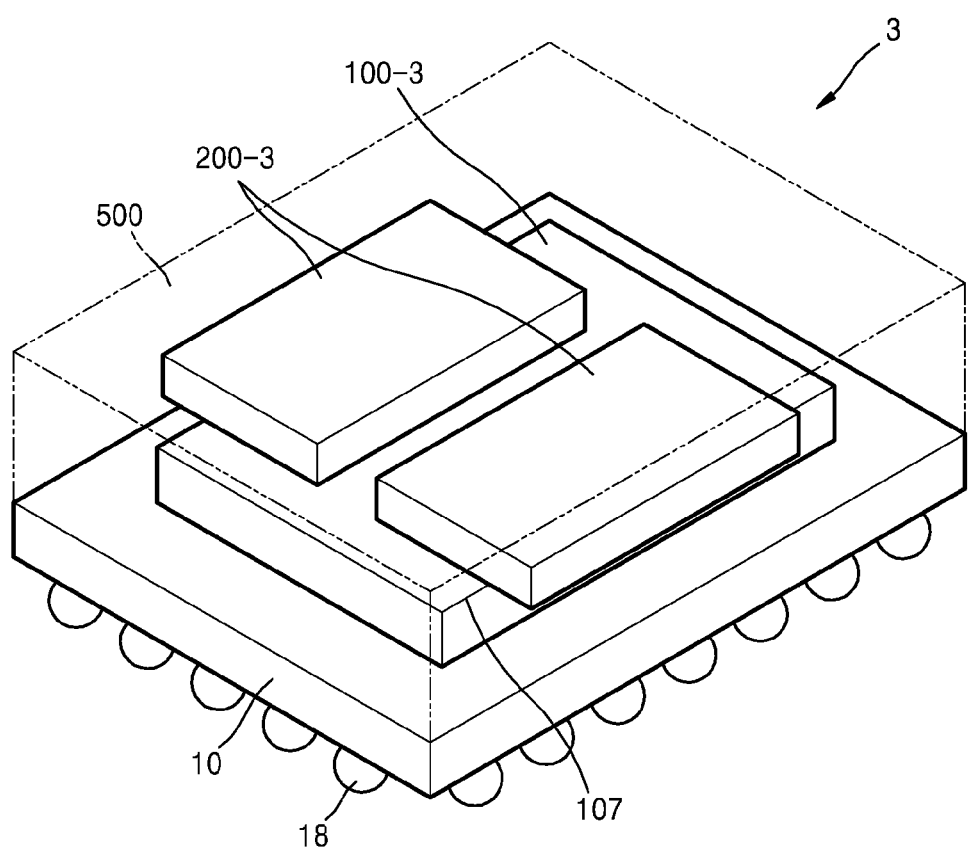
Figure 11:
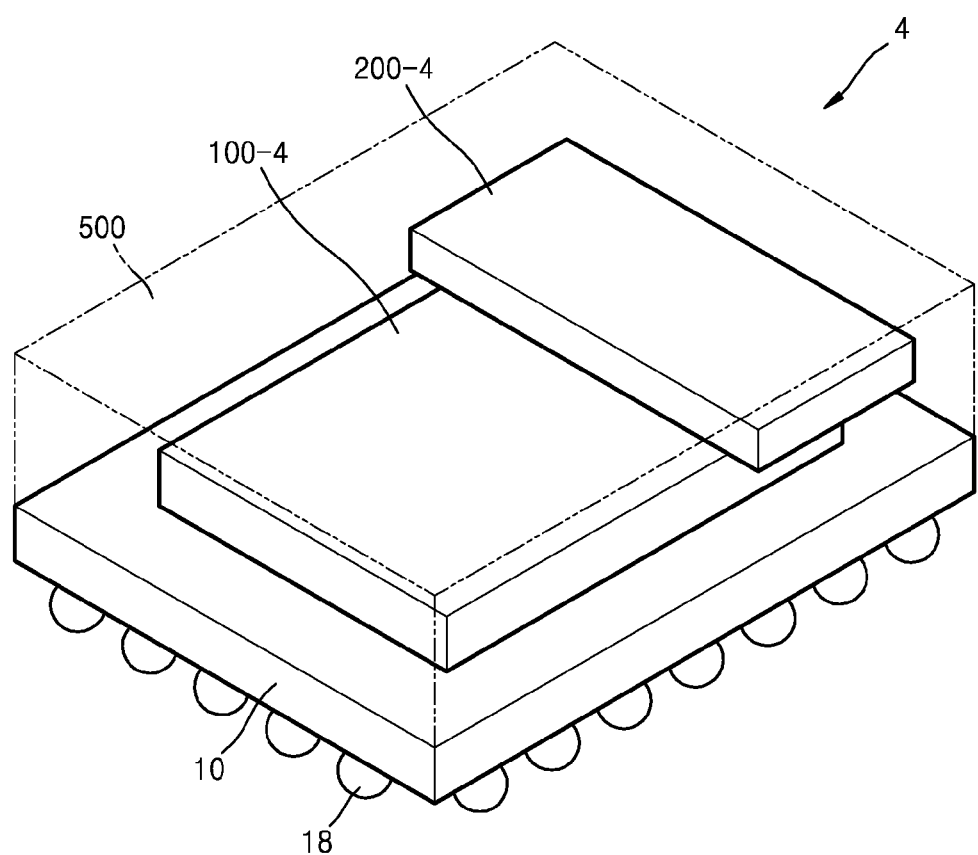
Figure 12:
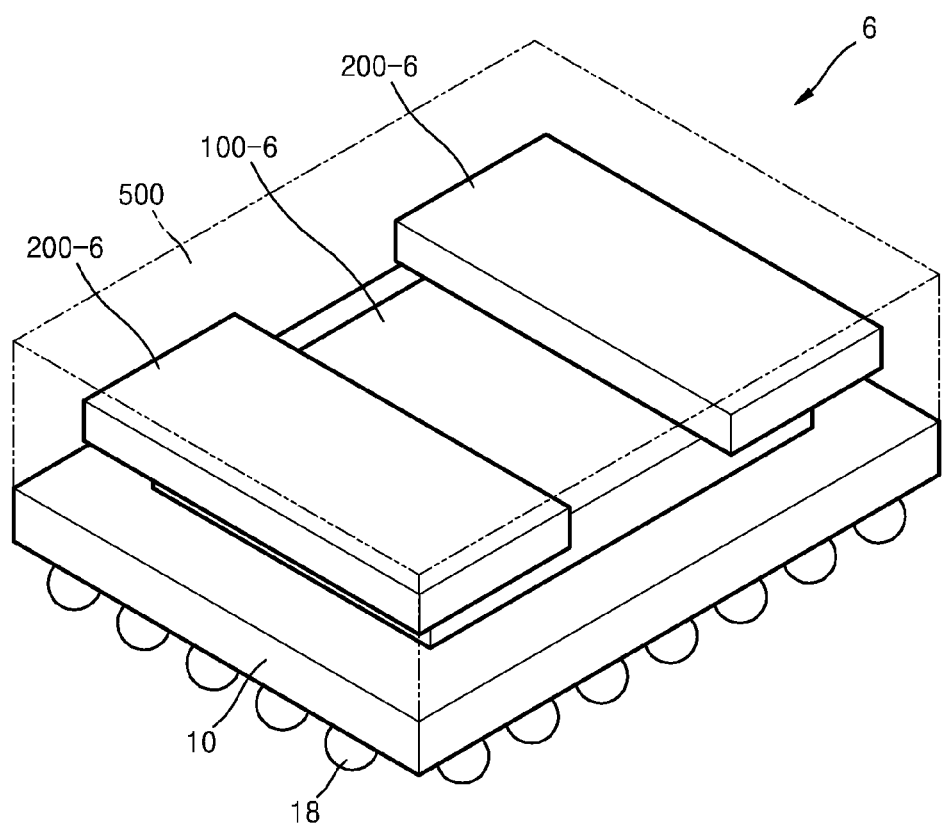
Figure 13:
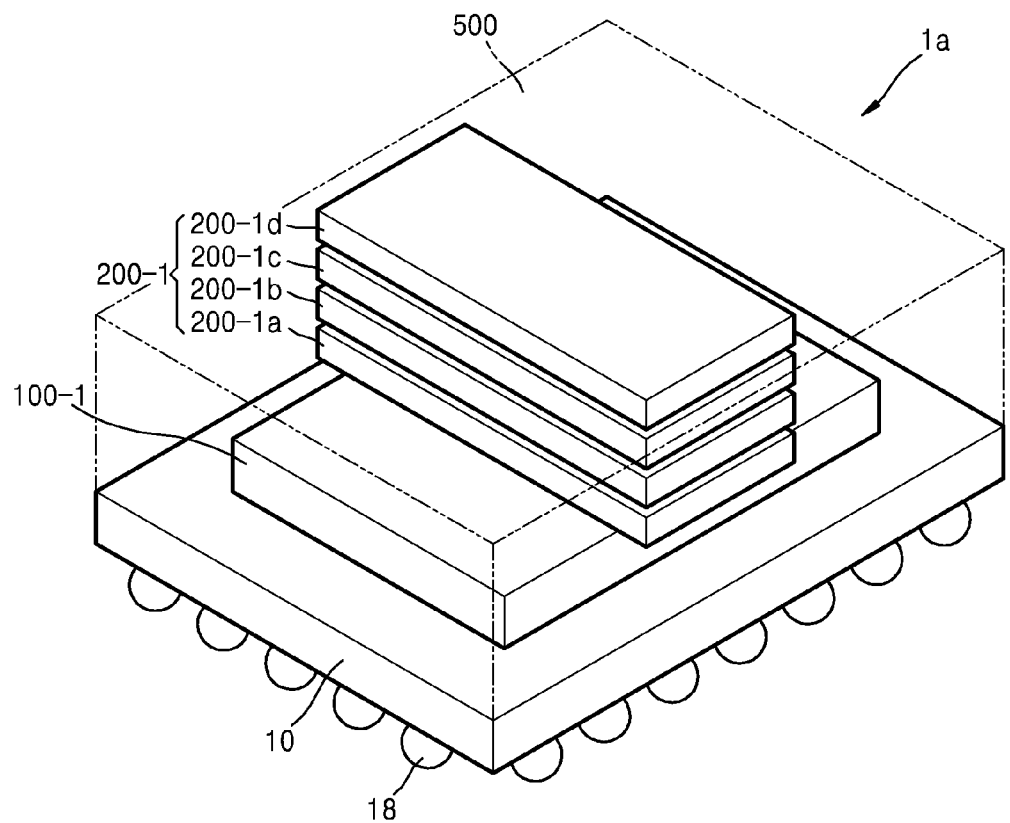

FIGS. 8 to 13 are schematic perspective views illustrating stacked semiconductor packages according to some embodiments of the inventive concepts. More specifically, FIGS. 8, 9 and 10 are perspective views of stacked semiconductor packages corresponding to the layouts shown in FIGS. 1, 2 and 3, respectively. In addition, FIG. 11 is a perspective view of a stacked semiconductor package corresponding to the layout shown in FIG. 4 or 5, and FIG. 12 is a perspective view of a stacked semiconductor package corresponding to the layout shown in FIG. 6 or 7. Moreover, FIG. 13 is another perspective view of a stacked semiconductor package corresponding to the layout shown in FIG. 1. In FIGS. 8 to 13, repeated descriptions already made with respect to FIGS. 1 to 7 are omitted. Also, in FIGS. 9 to 13, repeated descriptions already made with respect to FIG. 8 are omitted.

Referring to FIG. 8, a stacked semiconductor package 1 includes a package substrate 10, a lower chip 100-1, and an upper chip 200-1. The lower chip 100-1 may be adhered on the package substrate 10, and the upper chip 200-1 may be stacked on the lower chip 100-1. Similar to the embodiment shown in FIG. 1, the upper chip 200-1 may have a 230-1 a pad area 230-1 where a plurality of pads (not shown) corresponding to the plurality of through electrodes are disposed. The pad area 230-1 may be formed along a central axis that bisects an active surface of the upper chip 200-1 in a longitudinal direction. Such a pad area may also be formed in embodiments shown in FIGS. 9-13.

A molding layer 500 is formed on the package substrate 10 to encapsulate the lower chip 100-1 and the upper chip 200-1. The molding layer 500 may cover substantially the entire upper surface of the package substrate 10. However, the inventive concepts are not limited thereto. For example, the molding layer 500 may expose a portion of an upper surface of the package substrate 10. The molding layer 500 may be formed to cover the upper surface of the upper chip 200-1. However, the inventive concepts are not limited thereto. For example, the molding layer 500 may cover the side surface of the upper chip 200-1 and to expose an upper surface of the upper chip 200-1. When the upper surface of the upper chip 200-1 is not covered by the molding layer 500, that is, when the upper surface of the upper chip 200-1 is exposed, it may be used as a path through which heat generated in the stacked semiconductor package 1 is dissipated. In some embodiments, a heat sink (not shown) may be adhered on the upper chip 200-1.

External connection terminals 18 may be adhered on a lower surface of the package substrate 10 to exchange signals between the stacked semiconductor package 1 and an external device and to supply a power to the stacked semiconductor package 1.

A central axis in a longitudinal direction ("longitudinal central axis") of the upper chip 200-1 and a central axis in a longitudinal direction ("longitudinal central axis") of the lower chip 100-1 may cross at right angles. A portion of the upper chip 200-1 may project outward from an edge 87 of the lower chip 100-1. Opposite edge regions on a longitudinal side of an active surface of the upper chip 200-1 may project outward from edges, e.g., the edge 87, of the lower chip 100-1, respectively.

Referring to FIG. 9, a stacked semiconductor package 2 includes a package substrate 10, a lower chip 100-2, and an upper chip 200-2. The lower chip 100-2 is mounted on the package substrate 10, and the upper chip 200-2 may be stacked on the lower chip 100-2. A molding layer 500 may be formed on the package substrate 10 to encapsulate the lower chip 100-2 and the upper chip 200-2. External connection terminals 18 may be attached to a lower surface of the package substrate 10.

A central axis in a longitudinal direction of the upper chip 200-2 may be disposed such that it is shifted in parallel from a central axis in a longitudinal direction of the lower chip 100-2. A portion of the upper chip 200-2 may project outward from an edge 97 of the lower chip 100-2. That is, an edge region of the upper chip 200-2 on a transverse side thereof may project outward from the edge 97 of the lower chip 100-2, and another edge region of the upper chip 200-2 opposite to the projected edge region may be disposed on an active surface of the lower chip 100-2.

Referring to FIG. 10, a stacked semiconductor package 3 includes a package substrate 10, a lower chip 100-3, and a plurality of upper chips 200-3. The lower chip 100-3 is mounted on the package substrate 10, and the plurality of upper chips 200-3 are stacked on the lower chip 100-3. A molding layer 500 is formed on the package substrate 10 to encapsulate the lower chip 100-3 and the upper chips 200-3. External connection terminals 18 may be attached to a lower surface of the package substrate 10.

Central axes in a longitudinal direction of the upper chips 200-3 may be disposed such that they are shifted in parallel from a central axis in a longitudinal direction of the lower chip 100-3. For example, a central axis in a longitudinal direction of an active surface of each upper chip 200-3 is disposed such that it is shifted in parallel from a central axis in a longitudinal direction of the lower chip 100-3. Thus, the central axes in a longitudinal direction of the active surfaces of the pair of upper chips 200-3 may overlap opposite edges on transverse sides of the active surface of the lower chip 100-3, respectively.

A portion of each upper chip 200-3 may project outward from an edge 107 of the lower chip 100-3. That is, an edge region on a transverse side of an active surface of each upper chip 200-3 may project outward from the edge 107 of the lower chip 100-3, and another edge region on the transverse side of each upper chip 200-3 may be disposed on an active surface of the lower chip 100-3. For example, one of the opposite edge regions on the transverse sides of each of the two upper chips 200-3 may be disposed on the active surface of the lower chip 100-3, and the other edge regions of each upper chip 200-3 may project outward from edges, e.g., the edge 107, of the lower chip 100-3, respectively.

Referring to FIG. 11, a stacked semiconductor package 4 includes a package substrate 10, a lower chip 100-4, and an upper chip 200-4. A shape of the stacked semiconductor package 5 shown in FIG. 5 may be the same as that of the stacked semiconductor package 4 shown in FIG. 4 except that a ratio of a length in a longitudinal direction to a length in a transverse direction of the lower chip 100-5 and/or the upper chip 200-5 is different from a ratio of a length in a longitudinal direction to a length in a transverse direction of the lower chip 100-4 and/or the upper chip 200-4, and a perspective view thereof is thus omitted.

The lower chip 100-4 is mounted on the package substrate 10, and the upper chip 200-4 may be stacked on the lower chip 100-4. A molding layer 500 is formed on the package substrate 10 to encapsulate the lower chip 100-4 and the upper chip 200-4. External connection terminals 18 may be attached to a lower surface of the package substrate 10.

A central axis in a longitudinal direction of the upper chip 200-4 may be disposed such that it is shifted in parallel from a central axis in a traverse direction of the lower chip 100-4. A portion of the upper chip 200-4 may project outward from an edge of the lower chip 100-4. That is, an edge region on a transverse side of an active surface of the upper chip 200-4 may project outward from the edge of the lower chip 100-1, and a portion or an entire portion of another edge region of the upper chip 200-4 opposite to the projected edge region may be disposed on an active surface of the lower chip 100-4.

If a length of the upper chip 200-4 in the longitudinal direction is greater than that in a transverse direction of the lower chip 100-4, opposite edge regions on longitudinal sides of the active surface of the upper chip 200-4 may project outward from opposite edges on traverse sides of the lower chip 100-4 and an edge region on the transverse side of the active surface of the upper chip 200-4 may also project outward from an edge on the longitudinal side of the lower chip 100-4.

Referring to FIG. 12, a stacked semiconductor package 6 includes a package substrate 10, a lower chip 100-6, and upper chips 200-6. A shape of the stacked semiconductor package 7 shown in FIG. 7 may be the same as that of a stacked semiconductor package 6 shown in FIG. 6 except that a ratio of a length in a longitudinal direction to a length in a transverse direction of the lower chip 100-7 and/or the upper chip 200-7 is different from a ratio of a length in a longitudinal direction to a length in a transverse direction of the lower chip 100-6 and/or the upper chip 200-6, and a perspective view thereof is thus omitted.

The lower chip 100-6 may be mounted on the package substrate 10, and each of the upper chips 200-6 may be stacked on the lower chip 100-6. A molding layer 500 is formed on the package substrate 10 to encapsulate the lower chip 100-6 and the upper chips 200-6. External connection terminals 18 may be attached to a lower surface of the package substrate 10.

Central axes in a longitudinal direction of the upper chips 200-6 may be disposed such that they are shifted in parallel from a central axis in a traverse direction of the lower chip 100-6. For example, a central axis in a longitudinal direction of an active surface of each upper chip 200-6 is disposed such that it is shifted in parallel from a central axis in a traverse direction of the lower chip 100-6. Thus, the central axes in a longitudinal direction of the active surfaces of the pair of upper chips 200-6 may overlap a respective one of opposite edges on longitudinal sides of the active surface of the lower chip 100-6.

A portion of each upper chip 200-6 may project outward from an edge of the lower chip 100-6. That is, an edge on a transverse side of the active surface of each upper chip 200-6 may project outward from the edge of the lower chip 100-6, and a portion or an entire portion of another edge on the transverse side of each upper chip 200-6 may be disposed on the active surface of the lower chip 100-6. For example, a portion or an entire portion of one of opposite edge regions on the transverse side of each of the two upper chips 200-6 may be disposed on the active surface of the lower chip 100-6. Here, the edge regions of the two upper chips 200-6 disposed on the active surface of the lower chip 100-6 may oppose each other. The other edge region of opposite edge regions of each upper chip 200-6 may be disposed outside of an edge of the lower chip 100-6.

If a length in the longitudinal direction of the upper chip 200-6 is longer than that of the lower chip 100-6 in a transverse direction, edge regions on longitudinal sides of the active surface of the upper chip 200-6 may project outward from the edges of the lower chip 100-6 together with an edge region on a transverse side of the active surface of the upper chip 200-6.

Referring to FIG. 13, a stacked semiconductor package 1a includes a package substrate 10, a lower chip 100-1, and an upper chip 200-1. The lower chip 100-1 may be mounted on the package substrate 10, and the upper chip 200-1 may be mounted on the lower chip 100-1.

The upper chip 200-1 may be a semiconductor memory chip stack in which a plurality of slices 200-1a, 200-1b, 200-1c, and 200-1d are stacked. That is, the upper chip 200-1 may be formed of a plurality of semiconductor memory chips which are connected by a through electrode such as Through-Silicon Via (TSV) and are stacked. Also, in FIG. 13, there is shown an example in which the upper chip 200-1 includes four stacked slices 200-1a to 200-1d. However, the inventive concepts are not limited thereto. For example, it is possible to stack two or more slices.

The semiconductor memory chip stack described with reference to FIG. 13 is applicable to the upper chips 200-2 to 200-7 of the stacked semiconductor packages 2 to 7 shown in FIGS. 9 to 13.

Figure 14:
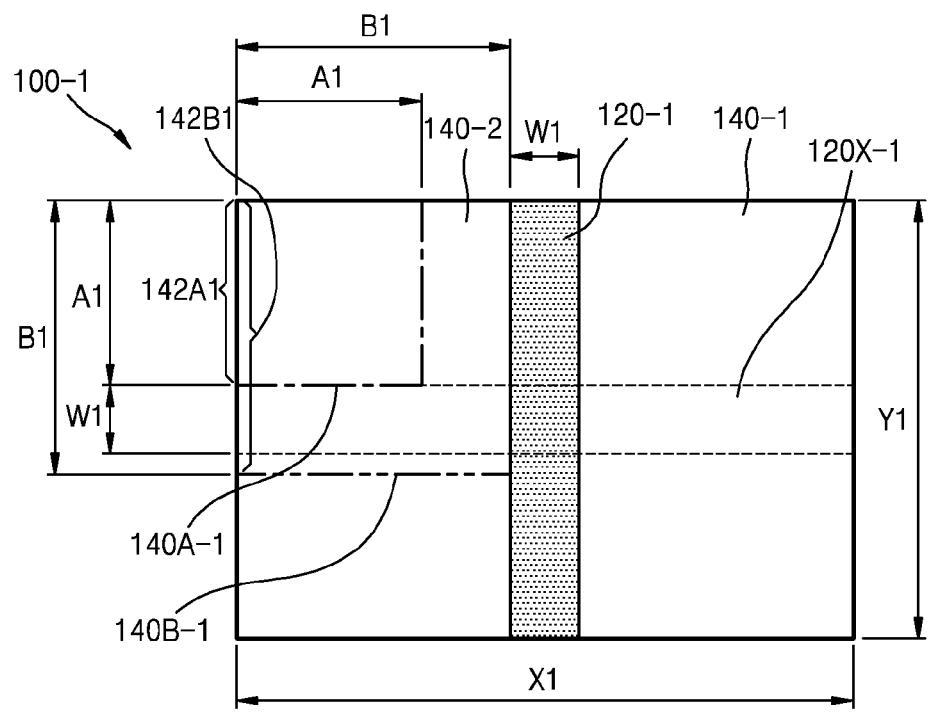
FIGS. 14 to 20 are schematic plan views illustrating a lower chip which a stacked semiconductor package according to an embodiment of the inventive concepts includes.

FIGS. 14 to 20 are schematic plan views illustrating lower chips which stacked semiconductor packages according to some embodiments of the inventive concepts include. The plan views of FIGS. 14 to 20 may be of lower chips included in layouts or structures of the stacked semiconductor packages 1 to 13 shown in FIGS. 1 to 13, respectively. For example, a stacked semiconductor package shown in FIG. 8 may include a lower chip having a layout structure including a functional block area illustrated in FIG. 14. In FIGS. 14 to 20, a description already made with reference to FIGS. 1 to 13 is omitted. Also, in FIGS. 15 to 20, a description already made with reference to FIG. 14 is omitted.

Referring to FIG. 14, a lower chip 100-1 may include a through electrode area 120-1 and function block areas such as first and second function block areas 140-1, 140-2, separate from the through electrode area 120-1. A plurality of function blocks (not shown) may be disposed in the function block area 140-1. For example, the lower chip 100-1 may comprise the first and second function block areas 140-1, 140-2 spaced apart from each other with the through electrode area 120-1 disposed therebetween. Thus, the first and second function block areas 140-1, 140-2 are respectively arranged on left and right side of the through electrode area 120-1. The first functional block area 140-1 may be a GPU area and the second functional block area 140-2 may be a CPU area. Alternatively, the first functional block area 140-1 may be a CPU area and the second functional block area 140-2 may be a GPU area. The lower chip 100-1 may have a first (longitudinal) length X1 extending in a longitudinal direction and a second (transverse) length Y1 extending in a transverse direction. The second length Y1 may be shorter than the first length X1. The through electrode area 120-1 may have a first width W1, measured in a longitudinal direction, and the through electrode area 120-1 may extend along the transverse direction of the active surface of the lower chip 100-1. The through electrode area 120-1 may be formed along a central axis extending in the transverse direction of the active surface of the lower chip 100-1.

If the lower chip 100-1 extends in the longitudinal direction and has a virtual through electrode area 120X-1 formed along the central axis in the longitudinal direction of the active surface, a virtual square area 140A-1 (representing the largest available area for a square function block capable of being disposed in the function block area 140-1) may be smaller than desirable. More particularly, a length A1 of each first edge portion 142A1 of a virtual square area 140A-1 may represent a maximum length of the first edge portions 142A1. The maximum length A1 of the first edge portions 142A1 may be equal to half of the difference between the second length Y1 and the first width W1 of the through electrode area 120-1, as represented by the equation A1=(Y1−W1)/2. In this case, it is impossible to dispose a function block in the virtual square area 140A-1 that has an area larger than the product of A1×A1.

According to principles of the present inventive concepts, however, as illustrated in FIG. 14, if the through electrode area 120-1 is formed along the central axis in the transverse direction, a length B1 of each second edge portion 142B1 of a maximum available square area 140B-1 (representing the largest available area for a function block capable of being disposed in the function block area 140-1) may be longer than the length A1 of the first edge portions 142A1. That is, the length B1 of the second edge portions 142B1 may equal to half the difference between the first (transverse) length X1 and the first width W1 of the through electrode area 120-1, as represented by the equation $B1=(X1-W1)/2$.

In other words, a function block that has an area where a length of each edge portion is longer than the length A1 may be disposed in the function block area 140-1 of the lower chip 100-1 according to principles of the present inventive concepts. More particularly, when the through electrode area 120-1 extends along a central axis in a transverse direction of the active surface, a function block requiring a rectangular area may be provided which has an area equal to or less than a product of B1 and the second length Y1. If a square area is required, the maximum available square area 140B-1 may be equal to $B1 \times B1$.

In summary, in the function block area 140-1, the square area 140A-1 represents the maximum available square area when the through electrode area 120-1 is arranged along a central axis disposed in the longitudinal direction. The square area 140A-1 has first edge portions 142A1, the length A1 of which is equal to half the difference between the transverse length Y1 of the lower chip and the width W1 of the through electrode area 120-1. However, when the through electrode area 120-1 is arranged along a transverse central axis, the maximum available square area is represented by the area 140B-1, where each edge portion 142B1 has a maximum length B1 that is longer than the length A1 of the first edge portion 142A1. The actual square area of the function block (or a virtual area for a function block) may, however, have an edge portion having a length C1 (not illustrated) between those of the first and second edge portions (e.g., A1 is less than or equal to C1 which is less than or equal to B1). The square area described above may represent an area of an actual component. However, the inventive concepts are not limited thereto. For example, the square area may be a virtual area representing an area available for a function block in the function block area 140-1.

Figure 15:
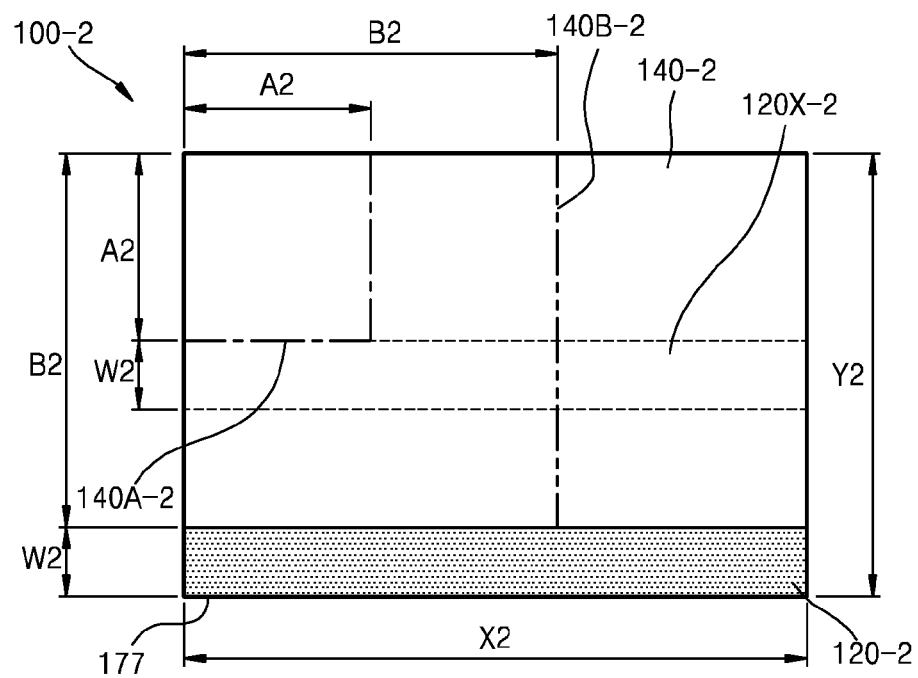

Referring to FIG. 15, a lower chip 100-2 includes a through electrode area 120-2 and a function block area 140-2 separate from the through electrode area 120-2. A plurality of function blocks (not shown) may be disposed in the function block area 140-2. The lower chip 100-2 may have a first length X2 and a second length Y2. The first length X2 is a length in a longitudinal direction, and the second length Y2 is a length in a transverse direction and is shorter than the first length X2. The through electrode area 120-2 may have a first width W2 in a transverse direction of an active surface of the lower chip 100-2 and may extend in a longitudinal direction of the active surface of the lower chip 100-2.

The through electrode area 120-2 may be adjacent to an edge 177 on a transverse side of the active surface of the lower chip 100-2.

If the lower chip 100-2 has the active surface that extends in the longitudinal direction and has a virtual through electrode area 120X-2 formed along the central axis in the longitudinal direction, a length of each edge of a virtual square area 140A-2 with the largest area capable of being arranged in the function block area 140-2 may be a length A2. That is, the length A2 may be half the difference between the second length Y2 and the first width W2 $(A2=(Y2-W2)/2)$. In this case, it is impossible to arrange, in the function block area 140-2, a function block that has a large rectangular area where a length of each edge is longer than the half of a difference between the second length Y2 and the first width W2 $(A2=(Y2-W2)/2)$.

As illustrated in FIG. 15, if the through electrode area 120-2 extends in the longitudinal direction of the active surface of the lower chip 100-2 and is adjacent to the edge 177, a length of each edge of a virtual maximum square area (i.e., maximum available square area) 140B-2 with the largest area capable of being disposed in the function block area 140-2 may be a length B2. That is, the length B2 may be a difference between the second length Y2 and the first width W2 $(B2=(Y2-W2))$.

A function block that has a large rectangular area where a length of each edge is longer than half of a difference between the second length Y2 and the first width W2 $(A2=(Y2-W2)/2)$ may be arranged in the function block area 140-2 of the lower chip 100-2.

That is, if the through electrode area 120-2 extends in the longitudinal direction of the active surface of the lower chip 100-2 and is adjacent to the edge 177 on the transverse side, in the function block area 140-2, there is disposed a function block that has a rectangular area where a length of each edge is longer than a length A2 (half of a difference between the second length Y2 and the first width W2 $(A2=(Y2-W2))$. Such a rectangular area may have an area equal to or smaller than a product of a difference between the second length Y2 and the first width W2 $(B2=(Y2-W2))$ and the first length X2.

In the function block area 140-2, there can be disposed a square area having an edge of which length is longer than half of a difference between the second length Y2 and the first width W2 $(A2=(Y2-W2)/2)$. Also, in the function block area 140-2, there can be disposed a square area having an edge of which length is longer than half of the difference between the second length Y2 and the first width W2 $(A2=(Y2-W2)/2)$ and equal to or shorter than the difference between the second length Y2 and the first width W2 $(B2=(Y2-W2))$.

Figure 16:
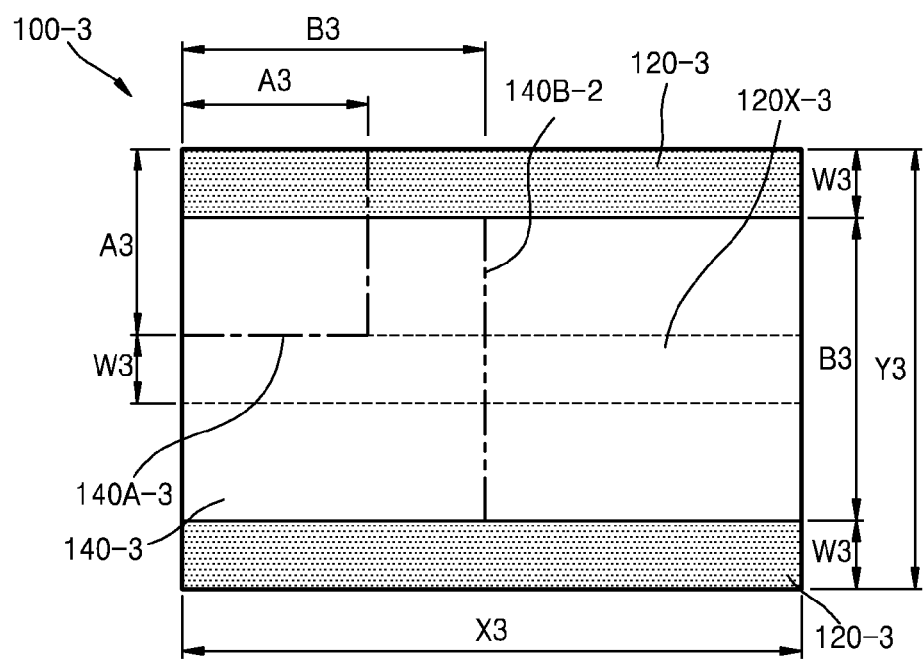

Referring to FIG. 16, a lower chip 100-3 includes a plurality of through electrode areas 120-3 and a function block area 140-3 separate from the through electrode areas 120-3. A plurality of function blocks (not shown) may be disposed in the function block area 140-2. The lower chip 100-3 may have a first length X3 and a second length Y3. The first length X3 is a length in a longitudinal direction, and the second length Y3 is a length in a transverse direction and is shorter than the first length X3. Each of the through electrode areas 120-3 may have a first width W3 in a transverse direction of an active surface of the lower chip 100-3 and may extend in a longitudinal direction of the active surface of the lower chip 100-3. Each of the through electrode areas 120-3 may be adjacent to a corresponding one of opposite edges on transverse sides of the active surface of the lower chip 100-3.

If the lower chip 100-3 has the active surface that extends in the longitudinal direction and has a virtual through electrode area 120X-3 formed along the central axis in the longitudinal direction, a length of each edge of a virtual square area 140A-3 with the largest area capable of being disposed in the function block area 140-3 may be a length A3. That is, the length A3 may be half of a difference between the second length Y3 and the first width W3 $(A3=(Y3-W3)/2)$. In this case, it is impossible to arrange, in the function block area 140-3, a function block that has a large rectangular area where a length of each edge is longer than half of the difference between the second length Y3 and the first width W3 $(A3=(Y3-W3)/2)$.

However, a length of each edge of a maximum available square area 140B-3 with the largest area capable of being disposed in the function block area 140-3 of the lower chip 100-3 may be a length B3. That is, the length B3 may be a difference between the second length Y3 and two times the first width W3 (B3=Y3−2*W3).

In the function block area 140-3 of the lower chip 100-3, there is disposed a large square area where a length of each edge is longer than half of a difference between the second length Y3 and the first width W3 (A3=(Y3−W3)/2).

In the function block area 140-3 of the lower chip 100-3, there can be disposed a function block that has a rectangular area where a length of each edge is longer than a length A3 being half of a difference between the second length Y3 and the first width W3 (A3=(Y3−W3)/2) and which has an area equal to or smaller than a product of a difference between the second length Y3 and two times the first width W3 (B3=(Y3−2*W3)) and the first length X3.

A square area having an edge of which length is longer than half of a difference between the second length Y3 and the first width W3 (A3=(Y3−W3)/2) may be disposed in the function block area 140-3. Also, in the function block area 140-3, there can be arranged a square area having an edge of which length is longer than half of the difference between the second length Y3 and the first width W3 (A3=(Y3−W3)/2) and equal to or shorter than a difference between the second length Y3 and two times the first width W3 (B3=(Y3−2*W3)).

Figure 17:
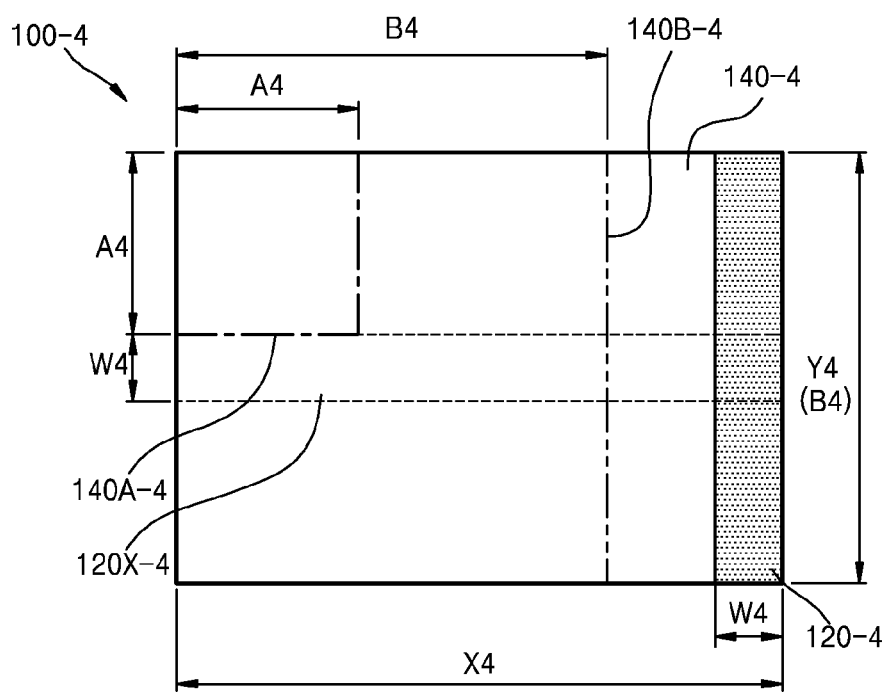

Referring to FIG. 17, a lower chip 100-4 includes a through electrode area 120-4 and a function block area 140-4 separate from the through electrode area 120-4. A plurality of function blocks (not shown) may be disposed in the function block area 140-4. The lower chip 100-4 may have a first length X4 and a second length Y4. The first length X4 is a length in a longitudinal direction, and the second length Y4 is a length in a transverse direction and is shorter than the first length X4. The through electrode area 120-4 may have a first width W4 in a longitudinal direction of an active surface of the lower chip 100-4 and may extend in a transverse direction of the active surface of the lower chip 100-4. The through electrode area 120-4 may be adjacent to an edge on a transverse side of the active surface of the lower chip 100-4. The second length Y4 may be shorter than a difference between the first length X4 and the first width W4 (Y4<X4−W4).

If the lower chip 100-4 has the active surface that extends in the longitudinal direction and has a virtual through electrode area 120X-4 formed along the central axis in the longitudinal direction, a length of each edge of a virtual square area (available square area) 140A-4 with the largest area capable of being disposed in the function block area 140-4 may be a length A4. That is, the length A4 may be half of a difference between the second length Y4 and the first width W4 (A4=(Y4−W4)/2). In this case, it is impossible to arrange, in the function block area 140-4, a function block that has a large rectangular area where a length of each edge is longer than half of a difference between the second length Y4 and the first width W4 (A4=(Y4−W4)/2).

However, a length of each edge of a maximum available square area 140B-4 with the largest area capable of being disposed in the function block area 140-4 of the lower chip 100-4 may be a length B4. That is, the length B4 of the second edge may be the second length Y4 (B4=Y4).

In the function block area 140-4 of the lower chip 100-4, there can be disposed a function block that has a large rectangular area where a length of each edge is longer than half of a difference between the second length Y4 and the first width W4 (A4=(Y4−W4)/2).

In the function block area 140-4 of the lower chip 100-4, there can be disposed a function block where a length of each edge is longer than a length A4 being half of a difference between the second length Y4 and the first width W4 (A4=(Y4−W4)/2) and which has an area equal to or smaller than a product of a difference between the first length X4 and the first width W4 (X4−W4) and the second length Y4 ((X4−W4)*Y4).

A square area having an edge of which length is longer than half of a difference between the second length Y4 and the first width W4 may be disposed in the function block area 140-4. Also, a square area having an edge of which length is equal to or shorter than the second length Y4 may be disposed in the function block area 140-4.

Figure 18:
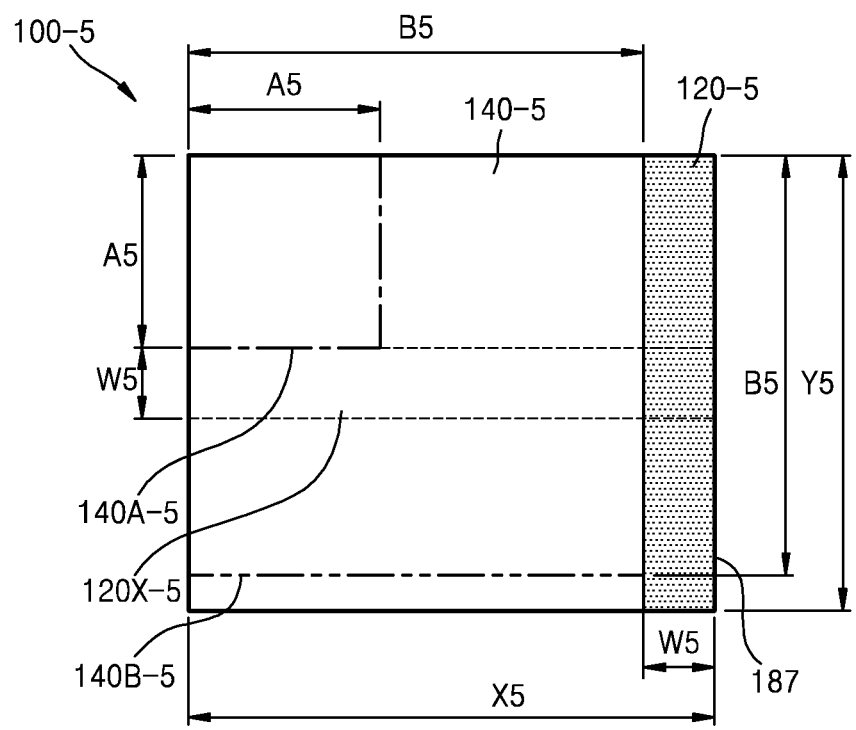

Referring to FIG. 18, a lower chip 100-5 includes a through electrode area 120-5 and a function block area 140-5 separate from the through electrode area 120-5. A plurality of function blocks (not shown) may be disposed in the function block area 140-5. The lower chip 100-5 may have a first length X5 and a second length Y5. The first length X5 is a length in a longitudinal direction, and the second length Y5 is a length in a transverse direction and is shorter than the first length X5. The through electrode area 120-5 may have a first width W5 in a longitudinal direction of an active surface of the lower chip 100-5 and may extend in a transverse direction of the active surface of the lower chip 100-5. The through electrode area 120-5 may be adjacent to an edge 187 on a longitudinal side of the active surface of the lower chip 100-5. The second length Y5 may be greater than a difference between the first length X5 and the first width W5 (Y5>X5−W5).

If the lower chip 100-5 has the active surface that extends in the longitudinal direction and has a virtual through electrode area 120X-5 formed along the central axis in the longitudinal direction, a length of each edge of a virtual square area 140A-5 with the largest area capable of being disposed in the function block area 140-5 may be a length A5. That is, the length A5 may be half of a difference between the second length Y5 and the first width W5 (A5=(Y5−W5)/2). In this case, it is impossible to arrange, in the function block area 140-5, a function block that has a large rectangular area where a length of each edge is longer than half of a difference between the second length Y5 and the first width W5 (A5=(Y5−W5)/2).

However, a length of each edge of a maximum available square area 140B-5 with the largest area capable of being disposed in the function block area 140-5 of the lower chip 100-5 may be a length B5. That is, the length B5 may be a difference between the first length X5 and the first width W5 (B5=X5−W5).

In the function block area 140-5 of the lower chip 100-5, there is disposed a function block that has a large rectangular area where a length of each edge is longer than half of a difference between the second length Y5 and the first width W5 (A5=(Y5−W5)/2).

In the function block area 140-5 of the lower chip 100-5, there can be disposed a function block where a length of each edge is longer than a length A5 of a first edge being half of a difference between the second length Y5 and the first width W5 (A5=(Y5−W5)/2) and which has an area equal to or smaller than a product of a difference between the first length X5 and the first width W5 (X5−W5) and the second length Y5 ((X5−W5)*Y5).

A square area having an edge of which length is longer than half of a difference between the second length Y5 and the first width W5 (A5=(Y5−W5)/2) may be disposed in the function block area 140-5. Also, a square area having an edge of which the length is longer than half a difference between the second length Y5 and the first width W5 (A5=(Y5−W5)/2) and equal to or shorter than a difference between the first length X5 and the first width W5 (B5=X5−W5) may be disposed in the function block area 140-5.

Figure 19:
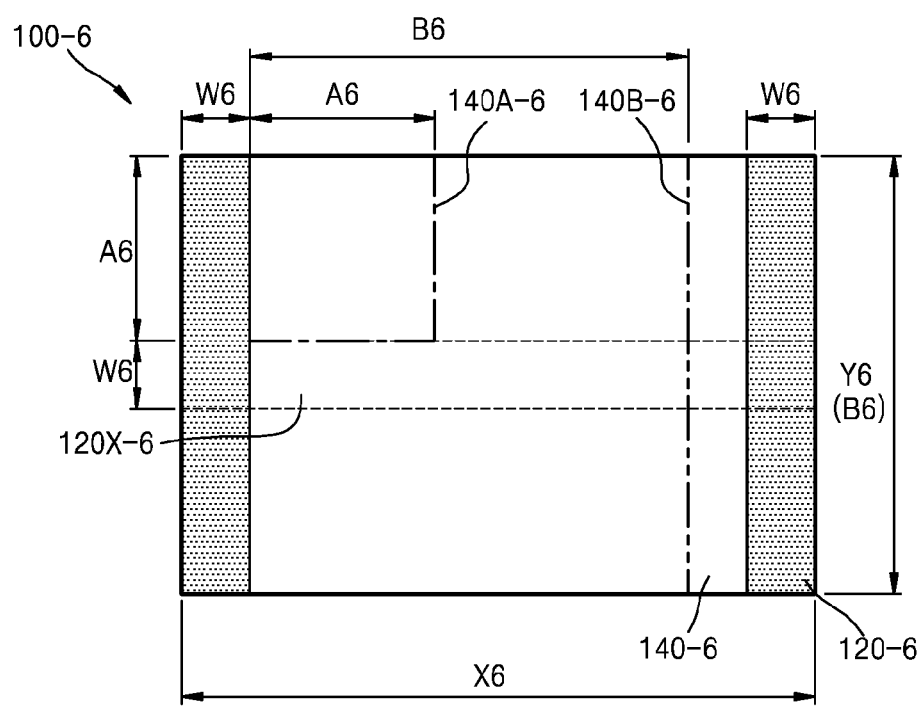

Referring to FIG. 19, a lower chip 100-6 includes a plurality of through electrode areas 120-6 and a function block area 140-6 separate from the through electrode areas 120-6. A plurality of function blocks (not shown) may be disposed in the function block area 140-6. The lower chip 100-6 may have a first length X6 and a second length Y6. The first length X6 is a length in a longitudinal direction, and the second length Y6 is a length in a transverse direction and is shorter than the first length X6. Each of the through electrode areas 120-6 may have a first width W6 in a longitudinal direction of an active surface of the lower chip 100-6 and may extend in a transverse direction of the active surface of the lower chip 100-6. Each of the through electrode areas 120-6 may be adjacent to an edge 195 or 197 on the longitudinal sides of the active surface of the lower chip 100-6. The second length Y6 may be less than a difference between the first length X6 and two times the first width W6 (Y6<X6−2*W6).

If the lower chip 100-6 has the active surface that extends in the longitudinal direction and has a virtual through electrode area 120X-6 formed along the central axis in the longitudinal direction, a length of each edge of a virtual square area 140A-6 with the largest area capable of being disposed in the function block area 140-6 may be a length A6. That is, the length A6 of the first edge 195 may be half of a difference between the second length Y6 and the first width W6 (A6=(Y6−W6)/2). In this case, it is impossible to arrange, in the function block area 140-6, a function block that requires a large rectangular area where a length of each edge is longer than half of a difference between the second length Y6 and the first width W6 (A6=(Y6−W6)/2).

However, a length of each edge of a maximum available square area 140B-6 with the largest area capable of being disposed in the function block area 140-6 of the lower chip 100-6 may be a length B6. That is, the length B6 of the second edge may be the second length Y6 (B6=Y6).

In the function block area 140-6 of the lower chip 100-6, there can be disposed a function block that requires a large rectangular area where a length of each edge is longer than half of a difference between the second length Y6 and the first width W6 (A6=(Y6−W6)/2).

In the function block area 140-6 of the lower chip 100-6, there can be disposed a function block where a length of each edge is longer than a length A6 being half of a difference between the second length Y6 and the first width W6 (A6=(Y6−W6)/2) and which has an area equal to or smaller than a product of a difference between the first length X6 and two times the first width W6 (X6−2*W6) and the second length Y6 ((X6−2*W6)*Y6).

A square area having an edge of which length is longer than half of a difference between the second length Y6 and the first width W6 may be disposed in the function block area 140-6. Also, a square area having an edge of which length is longer than half of a difference between the second length Y6 and the first width W6 (A6=(Y6−W6)/2) and equal to or shorter than the second length Y6 (Y6=B6) may be disposed in the function block area 140-6.

Figure 20:
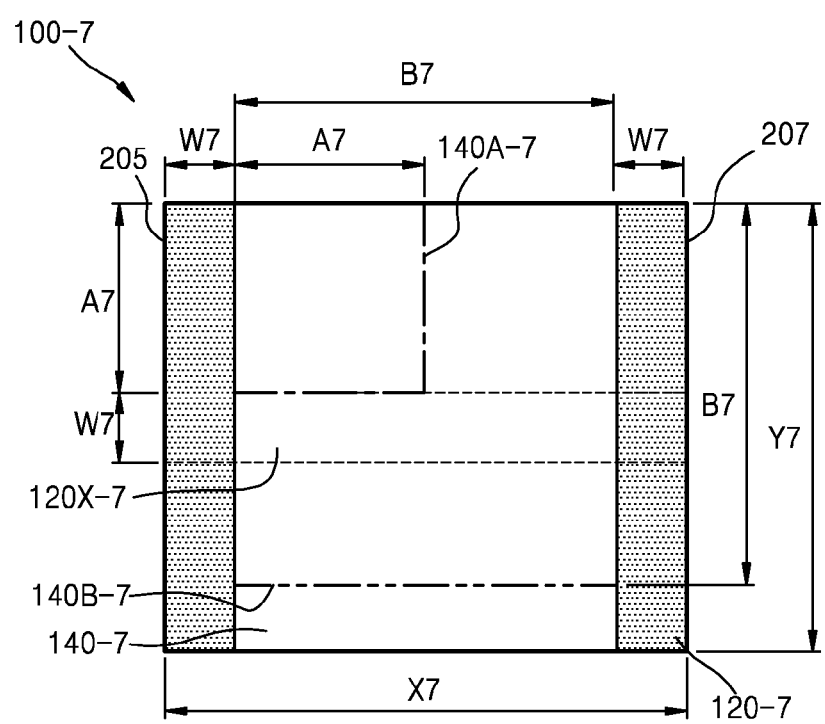

Referring to FIG. 20, a lower chip 100-7 includes a plurality of through electrode areas 120-7 and a function block area 140-7 separate from the through electrode areas 120-7. A plurality of function blocks (not shown) may be disposed in the function block area 140-7. The lower chip 100-7 may have a first length X7 and a second length Y7. The first length X7 is a length in a longitudinal direction, and the second length Y7 is a length in a transverse direction and is shorter than the first length X7. Each of the through electrode areas 120-7 may have a first width W7 in a longitudinal direction of an active surface of the lower chip 100-7 and may extend in a transverse direction of the active surface of the lower chip 100-7. Each of the through electrode areas 120-7 may be adjacent to an edge 205 or 207 on longitudinal sides of the active surface of the lower chip 100-7. The second length Y7 may be greater than a difference between the first length X7 and two times the first width W7 (Y7>X7−2*W7).

If the lower chip 100-7 has the active surface that extends in the longitudinal direction and has a virtual through electrode area 120X-7 formed along the central axis in the longitudinal direction, a length of each edge of a virtual square area 140A-7 with the largest area capable of being disposed in the function block area 140-7 may be a length A7. That is, the length A7 may be half of a difference between the second length Y7 and the first width W7 (A7=(Y7−W7)/2). In this case, it is impossible to dispose, in the function block area 140-7, a function block that has a large rectangular area where a length of each edge is longer than half of a difference between the second length Y7 and the first width W7 (A7=(Y7−W7)/2).

However, a length of each edge of a maximum available square area 140B-7 with the largest area capable of being disposed in the function block area 140-7 of the lower chip 100-7 may be a length B7. That is, the length B7 may be a difference between the first length X7 and two times the first width W7 (B7=X7−2*W7).

In the function block area 140-7 of the lower chip 100-7, there can be disposed a function block that has a large rectangular area where a length of each edge is longer than half of a difference between the second length Y7 and the first width W7 (A7=(Y7−W7)/2).

In the function block area 140-7 of the lower chip 100-7, there is disposed a function block where a length of each edge is longer than a length A7 being half of a difference between the second length Y7 and the first width W7 (A7=(Y7−W7)/2) and which has an area equal to or smaller than a product of a difference between the first length X7 and two times the first width W7 (B7=X7−2*W7) and the second length Y7 ((X7−2*W7)*Y7).

A square area having an edge of which length is longer than half of a difference between the second length Y7 and the first width W7 may be disposed in the function block area 140-7. Also, a square area having an edge of which length is longer than half of a difference between the second length Y7 and the first width W7 (A7=(Y7−W7)/2) and equal to or shorter than a difference between the first length X7 and two times the first width W7 (B7=X7−2*W7) may be disposed in the function block area 140-7.

Figure 21:
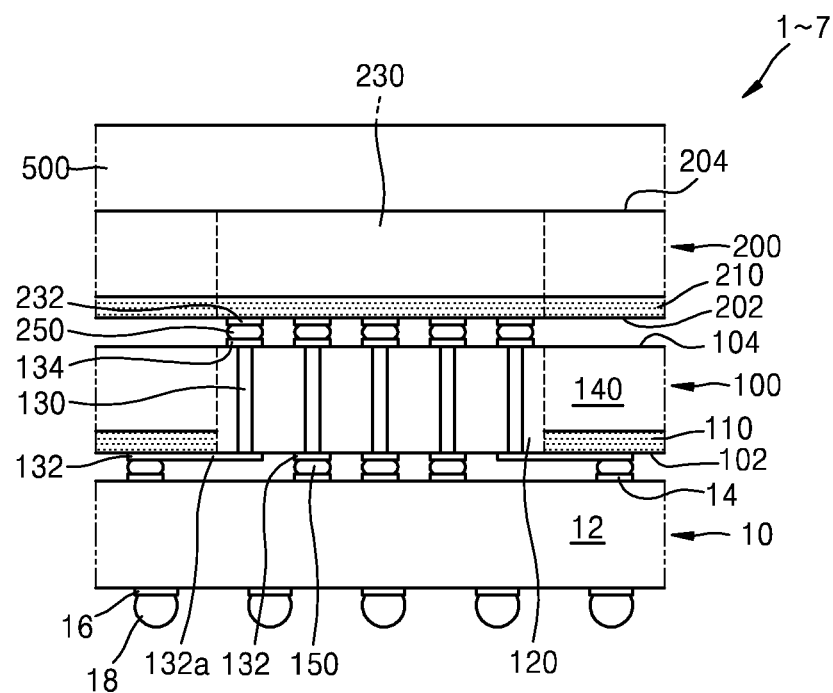
FIG. 21 is a schematic cross-sectional view illustrating a stacked semiconductor package according to an embodiment of the inventive concepts.

FIG. 21 is a schematic cross-sectional view illustrating a stacked semiconductor package according to an embodiment of the inventive concepts.

Referring to FIG. 21, a stacked semiconductor package (1~7) includes a package substrate 10, a lower chip 100 adhered on the package substrate 10, and an upper chip 200 adhered on the lower chip 100.

In FIG. 21, like the stacked semiconductor package 1 shown in FIG. 1, there is illustrated an example where function block areas 140 are disposed at both sides of a through electrode area 120 of the lower chip 100. However, such a layout that a function block area 140 is disposed at one side of the through electrode area 120 of the lower chip 100 may be applied to the stacked semiconductor packages 2 to 7 shown in FIGS. 2 to 7, and separate illustrations thereof may thus be omitted.

The package substrate 10 may be, for example, a printed circuit board, a ceramic substrate, or a read frame. If the package substrate 10 is a printed circuit board, it may include a substrate base 12 and upper and lower pads 14 and 16 respectively formed on upper and lower surfaces of the substrate base 12. The upper and lower pads 14 and 16 may be exposed by a solder resist layer (not shown), which covers the upper and lower surfaces of the substrate base 12, respectively.

The substrate base 12 may be formed of at least one selected from the group consisting of phenol resin, epoxy resin, and polyimide. For example, the substrate base 12 may include at least one selected from the group consisting of FR4, tetrafunctional epoxy, polyphenylene ether, epoxy/polyphenylene oxide), bismaleimide triazine (BT), thermount, cyanate ester, polyimide, and liquid crystal polymer.

Each of the upper and lower pads 14 and 16 may be formed of copper, nickel, stainless steel, or beryllium copper. Internal wirings (not shown) for electrically connecting the upper and lower pads 14 and 16 may be formed in the substrate base 12. The upper and lower pads 14 and 16 may be portions, exposed by the solder resist layer (not shown), of circuit wirings formed by patterning copper foils coated on the upper and lower surfaces of the substrate base 12. An external connection terminal 18 may be adhered on the lower pad 16 formed on the lower surface of the package substrate 10. The external connection terminal 18 may be, for example, a solder ball, a bump, or the like. The external connection terminal 18 may electrically connect the stacked semiconductor package 1, 2, 3, 4, 5, 6 or 7 to an external device.

The lower chip 100 may be electrically connected to the package substrate 10 adhered on the upper surface of the package substrate 10. A first semiconductor element 110 may be formed in a semiconductor substrate of the lower chip 100. The lower chip 100 may have an active surface 102 and a non-active surface 104 opposite to the active surface 102. The lower chip 100 may be adhered on the upper surface of the package substrate 10 with the active surface 102 facing the package substrate 10.

The semiconductor substrate of the lower chip 100, for example, may include silicon. Alternatively, the semiconductor substrate of the lower chip 100 may include a semiconductor element such as germanium or a compound semiconductor such as silicon carbide (SiC), gallium arsenide (GaAs), indium arsenide (InAs), and indium phosphide (InP). Or, the semiconductor substrate of the lower chip 100 may have a silicon on insulator (SOI) structure. For example, the semiconductor substrate of the lower chip 100 may include a buried oxide (BOX) layer. The semiconductor substrate of the lower chip 100 may include a conductive area: a well doped with impurities or a structure doped with impurities. Also, the semiconductor substrate of the lower chip 100 may have a variety of device isolation structures such as a shallow trench isolation (STI) structure.

The first semiconductor element 110 may include various sorts of individual devices. The individual devices may include, for example, microelectronic devices: metal-oxide-semiconductor field effect transistors (MOSFETs) such as a complementary metal-insulator-semiconductor (CMOS) transistor, a system large scale integration (LSI), an image sensor such as a CMOS imaging sensor (CIS), a micro-electro-mechanical system (MEMS), active elements, and passive elements. The first semiconductor element 110 may further comprise at least two of the individual devices or a conductive wiring or a conductive plug for electrically connecting the individual devices with the conductive area of the semiconductor substrate of the lower chip 100. Also, the individual devices may be electrically separated from other individual devices adjacent to the individual devices by insulation films, respectively.

The first semiconductor element 110 may include a wiring structure for connecting the individual devices to a first front pad 132. The wiring structure may include a metal wiring layer and a via plug. The metal wiring layer and the via plug may be formed of a barrier film for wiring and a metal layer for wiring. The barrier film for wiring may include at least one selected from the group consisting of Ti, TiN, Ta, and TaN. The metal layer for wiring may include at least one selected from the group consisting of W, Al, and Cu. The metal wiring layer and the via plug may be formed of the same material. Alternatively, the metal wiring layer and the via plug may be formed such that at least a portion of the metal wiring layer is different from at least a portion of the via plug. The metal wiring layer and/or the via plug may be formed to have a multi-layer structure. That is, the wiring structure may be a multi-layer structure in which two or more metal wiring layers or two or more via plugs are stacked in turn. A front protection layer (not shown) may be formed on the first semiconductor element 110 of the lower chip 100 to protect the first semiconductor element 110 from external impact or moisture. The first front pad 132 may be exposed on the active surface 102 of the lower chip 100 by the front protection layer. A first rear pad 134 may be formed on the non-active surface 104 of the lower chip 100.

A through electrode 130 may be formed in the lower chip 100 to connect the first front pad 132 and the first rear pad 134 electrically by passing through the semiconductor substrate of the lower chip 100. The through electrode 130 may have a pillar shape which passes through the semiconductor substrate of the lower chip 100.

The through electrode 130 may be formed of a Through Silicon Via (TSV). The through electrode 130 may include a wiring metal layer (not shown) and a barrier metal layer (not shown) surrounding the wiring metal layer. The wiring metal layer may be formed of Cu, CuSn, CuMg, CuNi, CuZn, CuPd, CuAu, CuRe, CuW, W, or W alloy. However, the inventive concepts are not limited thereto. For example, the wiring metal layer may include one or more of Al, Au, Be, Bi, Co, Cu, Hf, In, Mn, Mo, Ni, Pb, Pd, Pt, Rh, Re, Ru, Ta, Te, Ti, W, Zn, and Zr, and it may include one or more stack structures. The barrier metal layer may include at least one selected from the group consisting of W, WN, WC, Ti, TiN, Ta, TaN, Ru, Co, Mn, WN, Ni, and NiB, and it may be formed of a single layer or a plurality of layers. However, a material of the through electrode 130 may not be limited to the above-described material. The barrier metal layer and the wiring metal layer may be formed using a physical vapor deposition (PVD) process or a chemical vapor deposition (CVD) process. However, the inventive concepts are not limited thereto. A spacer insulation layer (not shown) may be interposed between the through electrode 130 and the semiconductor substrate of the lower chip 100. The spacer insulation layer may prevent direct connection between the first semiconductor element 110 and the through electrode 130. The spacer insulation layer may be formed of an oxide film, a nitride film, a carbonized film, a polymer, or a combination thereof. In some embodiments, the CVD process may be used to form the spacer insulation layer. The spacer insulation layer may be formed of a high aspect ratio process (HARP) oxide film based on ozone/tetra-ethyl-ortho-silicate (O3/TEOS) formed using a sub-atmospheric CVD process.

There is described an example where the through electrode 130 directly connects the first front pad 132 and the first rear pad 134. However, the inventive concepts are not limited thereto. For example, the through electrode 130 may be formed of a via-first, via-middle, or via-last structure. The via-first, via-middle, or via-last structure and a fabrication method may be disclosed in the references: Three Dimensional System Integration, in 2011, at Springer, 3D Integration for VLSI Systems, in 2012, at CRC Press, and Designing TSVs for 3D Integrated Circuits, in 2013, at Springer.

The first front pad 132 may be formed on the through electrode 130 to be electrically connected to the through electrode 130. Alternatively, the first front pad 132 may be formed at a location spaced apart from the upper surface of the through electrode 130 such that it is electrically connected to the through electrode 130 through a redistribution layer 132a.

A first connection bump 150 may be disposed between the first front pad 132 of the lower chip 100 and the upper pad 14 of the package substrate 10 to connect the first front pad 132 and the upper pad 14 electrically. The first connection bump 150 and the upper pad 14 may be connected by Thermo Compression Bonding or Reflow Bonding. The lower chip 100 may be electrically connected to the package substrate 10 through the first connection bump 150.

The lower chip 100 includes the through electrode area 120 and the function block area 140 arranged apart from the through electrode area 120. A plurality of through electrodes 130 may be disposed in the through electrode area 120. A plurality of through electrodes 130 may be formed in the through electrode area 120 to pass through the lower chip 100, and the first semiconductor element 110 may not be formed at the through electrode area 120. Thus, most of the first semiconductor element 110 may be formed in the function block area 140. However, the inventive concepts are not limited thereto. The first semiconductor element 110, other than some passive elements, in particular, function blocks 142, 142M, 142X, and 142Y (refer to FIG. 22), may not be formed at a portion where the through electrode 130 is formed. In this specification of the inventive concepts, however, the through electrode area 120 may be an area where the plurality of through electrodes 130 are formed, and it may mean an area which has a constant width and extends in a constant direction. Thus, the through electrode 130 may not be formed at a part of the through electrode area 120. In exemplary embodiments, small function blocks 142X and 142Y (refer to FIG. 22) may be formed at a part of the through electrode area 120. This will be more fully described with reference to FIG. 22.

A second semiconductor element 210 may be formed at a semiconductor substrate of the upper chip 200. The upper chip 200 may have an active surface 202 where the second semiconductor element 210 is formed and a non-active surface 204 opposite to the active surface 202. The upper chip 200 may be stacked on the lower chip 100 with the active surface 202 facing the lower chip 100. A description about the semiconductor substrate of the upper chip 200 and the second semiconductor element 210 may be the same as a description about the semiconductor substrate of the lower chip 100 and the first semiconductor element 110 and thus is omitted.

A pad 232 may be formed on the active surface 202 of the upper chip 200. A second connection bump 250 may be disposed between the pad 232 of the upper chip 200 and the first rear pad 134 of the lower chip 100 to connect the pad 232 and the first rear pad 134 electrically. Thus, the upper chip 200 may be electrically connected to the package substrate 10 through the first rear pad 134 and the through electrode 130.

The pad 232 of the upper chip 200 may be formed on a pad area 230. The pad 232 may be formed on the active surface 202 of the upper chip 200, and the second semiconductor element 210 may be formed over the whole active surface 202 of the upper chip 200 including the pad area 230.

A mold layer 500 may surround the lower chip 100 and the upper chip 200. The mold layer 500 may be formed of, for example, Epoxy Mold Compound (EMC). Also, in FIG. 21, there is illustrated an example where the mold layer 500 covers the non-active surface 204 of the upper chip 200. However, the inventive concepts are not limited thereto. To dissipate heat generated in a stacked semiconductor package (1~7), the mold layer 500 may be formed to expose the non-active surface 204 of the upper chip 200.

There is illustrated an example where a space exists between the package substrate 10 and the lower chip 100 and/or between the lower chip 100 and the upper chip 200. However, the inventive concepts are not limited thereto. The stacked semiconductor package (1~7) may further comprise an underfill layer (not shown) which is filled between the package substrate 10 and the lower chip 100 and/or between the lower chip 100 and the upper chip 200. The underfill layer may be formed by a capillary underfill method or by adhering a non-conductive film. Alternatively, the under-fill layer may be formed through a Molded Underfill (MUF) process when the mold layer 500 is formed.

Figure 22:
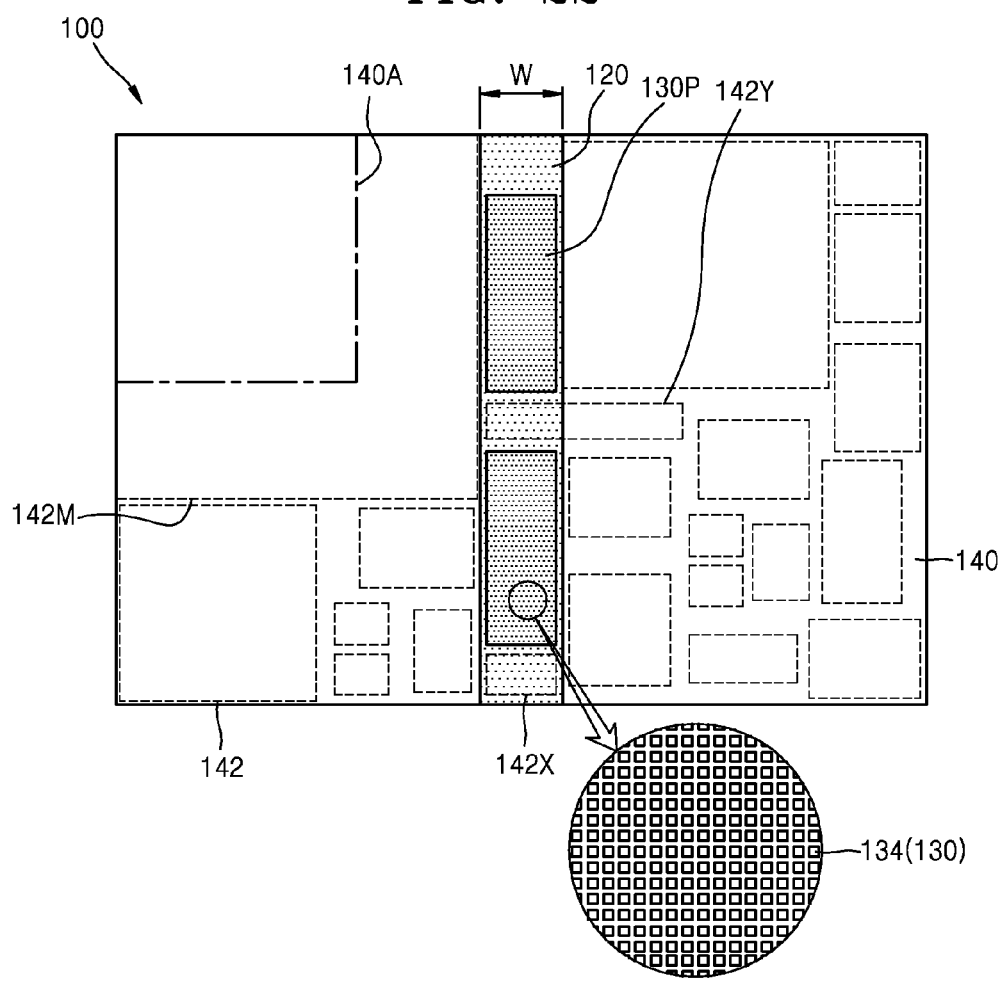
FIG. 22 is a layer schematically illustrating a lower chip included in a stacked semiconductor package according to an embodiment of the inventive concepts.

FIG. 22 is a layer schematically illustrating a lower chip 100 included in a stacked semiconductor package according to an embodiment of the inventive concepts. FIG. 22 shows a layout similar to the lower chip 100-1 shown in FIG. 1. A layout shown in FIG. 22 may be similar to those of the lower chips 100-2 to 100-7 shown in FIGS. 2 to 7 except for a location of a through electrode area 120.

Referring to FIG. 22, the lower chip 100 includes the through electrode area 120 and a function block area 140 arranged apart from the through electrode area 120. The through electrode area 120 may have a first width W and may extend between opposite edges of the lower chip 100. For example, the first width W may be several hundreds on.

The through electrode area 120 may include a through electrode portion 130P where a plurality of through electrodes 130 are disposed. The plurality of through electrodes 130 disposed in the through electrode portion 130P may be formed in a matrix of rows and columns. A width of the through electrode portion 130P may be equal to or a little less than the first width W. The through electrode area 120 may mean an area which extends with the first width W and where a function block 142 is not disposed in the first width W on the basis of a portion where the through electrode 130 is formed, that is, the through electrode portion 130P.

Hundreds or thousands of through electrodes 130 may be formed in the through electrode area 120. The hundreds or thousands of through electrodes 130 may be disposed to form a matrix within one or more through electrode portions 130P, respectively. A first rear pad 134 may be formed on each of the plurality of through electrodes 130. For ease of description, in FIG. 22, there is illustrated an example where a through electrode 130 is not arranged apart from the first rear pad 134.

In the through electrode portion 130P, the plurality of through electrodes 130 or a plurality of first rear pads 134 may form a matrix such that they are spaced apart from one another in a column direction (e.g., a first-width direction) with a several-ten-μm-wide pitch and in a row direction with a several-ten-μm-wide pitch. For example, the plurality of through electrodes 130 may be disposed to have a 40-μm-wide pitch in a column direction and a 50-μm-wide pitch in a row direction.

A plurality of function blocks 142 may be disposed in the function block area 140. Each of the plurality of function blocks 142 may have a square or rectangular area.

Here, a function block may also be referred to as Intellectual Property (IP). If the lower chip 100 is a SoC, a function block may mean a unit block that is separated into a function block capable of being developed actually. The SoC may be formed by designing function blocks independently and disposing and combing the function blocks.

A portion of the function block 142 may necessitate a relatively large area. A portion, necessitating an area larger than that of a virtual square area 140A, from among the function blocks disposed in the function block area 140 may be referred to as a main function block 142M. The virtual square area 140A may correspond to each of the virtual square areas 140A-1 to 140A-7 shown in FIGS. 14 to 20. The main function block 142M may be a central processing unit (CPU) or a graphics processing unit (GPU), for example. In the main function block 142M, a length of each edge may be longer than half of a difference between a length in a transverse direction of the lower chip 100 and the first width W.

A portion of the function block 142, in particular, the main function block 142M necessitating a relatively large area may require an area that is approximately a square. The function block 142 may perform an individual function as a portion of the lower chip 100 or as a component of a system made up of the SoC. Since the main function block 142M necessitates a relatively large area and is a component requiring relatively high performance, it may be designed such that an electrical path in the main function block 142M is minimized Thus, the main function block 142M may be designed to have a square area with a horizontal to vertical ratio (or, longitudinal to transverse ratio) of approximately "1", not a rectangular area with a large horizontal to vertical ratio (or, longitudinal to transverse ratio). For example, one, having a horizontal to vertical ratio of approximately "1", from among main function blocks 142M with the same area may have high performance as compared with a main function block 142M with a relatively large horizontal to vertical ratio.

The main function block 142M capable of being disposed in the lower chip 100 may be decided based on the size of a square area capable of being disposed in the function block area 140, not the size of the whole area of the function block area 140 of the lower chip 100. Thus, as the size of a square area capable of being disposed in the function block area 140 of the lower chip 100 increases, there may be used the main function block 142M that necessitates a relatively large area and relatively high performance.

The size of the function block 142 capable of being disposed in the lower chip 100, in particular, the area of the main function block 142M may correspond to the size of a square or rectangular area described with reference to FIGS. 14 to 20.

Since the arrangement of the through electrodes 130 conforms to the arrangement of pads of an upper chip to be described later, the through electrodes 130 may not be disposed in a portion of the through electrode area 120. That is, the through electrodes 130 may not be arranged in the remaining portion of the through electrode area 120 other than the through electrode portion 130P. Thus, it is possible to arrange relatively small function blocks 142X and 142Y or a portion thereof in a portion of the through electrode area 120 where the through electrode 130 is not disposed.

In FIG. 22, there is illustrated an example where the through electrode area 120 includes two through electrode portions 130P that are separate from each other. However, the inventive concepts are not limited thereto. For example, the number of through electrode portions 130P may be 1 or 4 or more (even-numbered).

The through electrode portion 130P may have a shape corresponding to that of a pad portion of an upper chip to be described later. The arrangement and shape of the through electrode portion 130P of the through electrode area 120 may correspond to those of a pad portion of an upper chip shown in FIGS. 24 and 25. Thus, there are omitted the arrangement and shape of the through electrode portion 130P corresponding to those of a pad portion of an upper chip shown in FIGS. 24 and 25.

Figure 23:
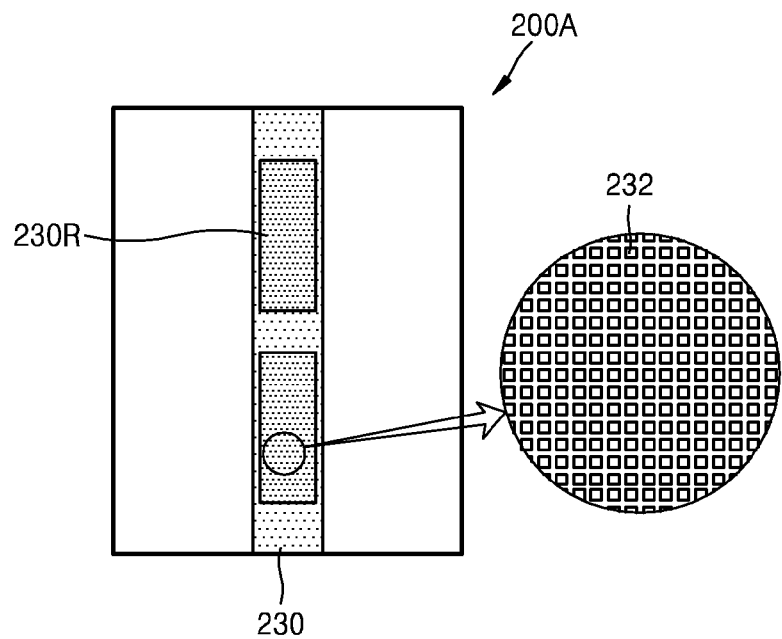
FIGS. 23 to 25 are layouts schematically illustrating an upper chip included in a stacked semiconductor package according to an embodiment of the inventive concepts.
Figure 24:
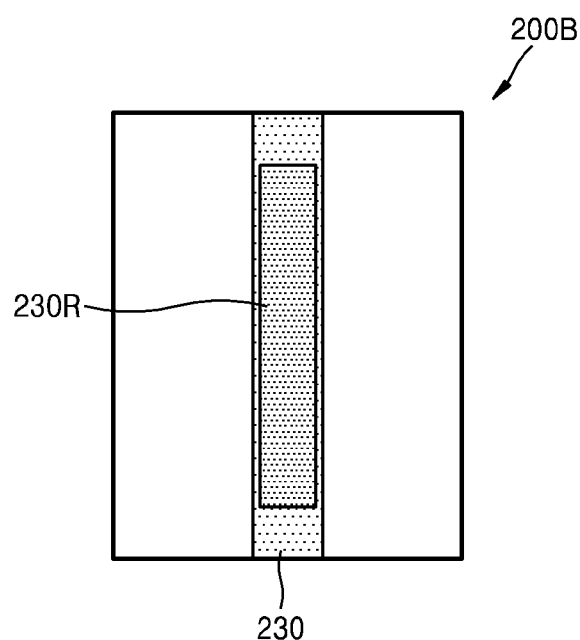
Figure 25:
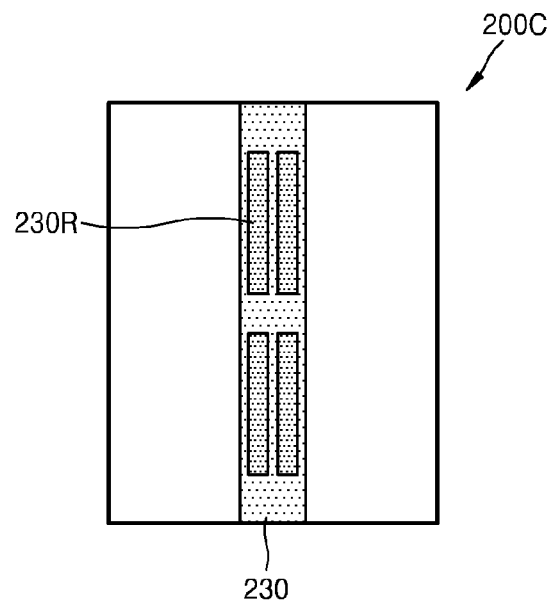

FIGS. 23 to 25 are layouts schematically illustrating an upper chip included in a stacked semiconductor package according to an embodiment of the inventive concepts. In FIGS. 24 and 25, a description already made with reference to FIG. 23 is omitted.

Referring to FIG. 23, an upper chip 200A may have a pad area 230 that is disposed along a central axis bisecting the upper chip 200A. The pad area 230 may have a width equal or similar to the first width W of the through electrode area 120 shown in FIG. 22 and may extend between opposite edges of the upper chip 200A. The pad area 230 may be formed along a central axis in a longitudinal direction of the upper chip 200A.

A pad portion 230R where a plurality of pads 232 are disposed may be disposed in the pad area 230. Two pad portions 230R that are separate from each other may be disposed in the pad area 230. However, the inventive concepts are not limited thereto. The pad portion 230R may be formed to include a plurality of pads 232 arranged in a matrix form along rows and columns. A width of the pad portion 230R may be equal to or less than that of the pad area 230. Hundreds or thousands of pads 232 may be formed in the pad area 230.

The hundreds or thousands of pads 232 may be disposed in the one or more pad portions 230R to form a matrix.

In the pad portion 230R, the plurality of pads 232 may form a matrix such that they are separate from one another in a column direction (e.g., a width direction of the pad area 230) with a several-ten-μm-wide pitch and in a row direction with a several-ten-μm-wide pitch. For example, the plurality of pads 232 may be disposed in the pad portion 230R to have a 40-μm-wide pitch in a column direction and a 50-μm-wide pitch in a row direction. That is, the plurality of pads 232 may be disposed to correspond to a plurality of through electrodes 130 shown in FIG. 22.

Referring to FIG. 24, an upper chip 200B may have a pad area 230 that is disposed along a central axis bisecting the upper chip 200B. The pad area 230 may have a width equal or similar to the first width W of the through electrode area 120 shown in FIG. 22 and may extend between opposite edges of the upper chip 200B. The pad area 230 may be formed along a central axis in a longitudinal direction of the upper chip 200B.

A pad portion 230R where a plurality of pads 232 (refer to FIG. 21) are disposed may be disposed in the pad area 230. In FIG. 24, there is illustrated an example where one pad portion 230R is disposed in the pad area 230. The plurality of pads 232 may be formed in the pad area 230 to form a matrix of rows and columns.

Referring to FIG. 25, an upper chip 200C may have a pad area 230 that is disposed along a central axis bisecting the upper chip 200C. The pad area 230 may have a width equal or similar to the first width W of the through electrode area 120 shown in FIG. 22 and may extend between opposite edges of the upper chip 200C. The pad area 230 may be formed along a central axis in a longitudinal direction of the upper chip 200C.

A pad portion 230R where a plurality of pads 232 (refer to FIG. 21) are disposed may be disposed in the pad area 230. In FIG. 25, there is illustrated an example where four pad portions 230R are disposed in the pad area 230. For example, each pair of pad portions 230R disposed in a column direction may be separate from the other, and each pair of pad portions 230R disposed in a row direction may be separate from the other. The plurality of pads 232 may be formed in each pad area 230 to form a matrix of rows and columns.

The upper chips 200A, 200B, and 200C shown in FIGS. 23 to 25 may be a semiconductor memory chip, for example. In the upper chips 200A, 200B, and 200C, a pad area 230, a pad portion 230R disposed in the pad area 230, and/or a plurality of pads 232 disposed in the pad portion 230R may be arranged according to a standard regulation such as the JEDEC Standard.

In a stacked semiconductor package according to an embodiment of the inventive concepts, if a shape of an upper chip, in particular, a pad area, a pad portion, and/or a plurality of pads are disposed according to the standard regulation, a main function block with relatively high performance may be disposed in a lower chip by deciding a shape of a lower chip corresponding to a pad area, a pad portion, and/or a plurality of pads, in particular, a method of disposing a through electrode area.

Since a main function block with a relatively large area is disposed, it is easy to place a function block upon designing of a semiconductor chip (e.g., a lower chip according to an embodiment of the inventive concepts) such as an SoC.

Figure 26:
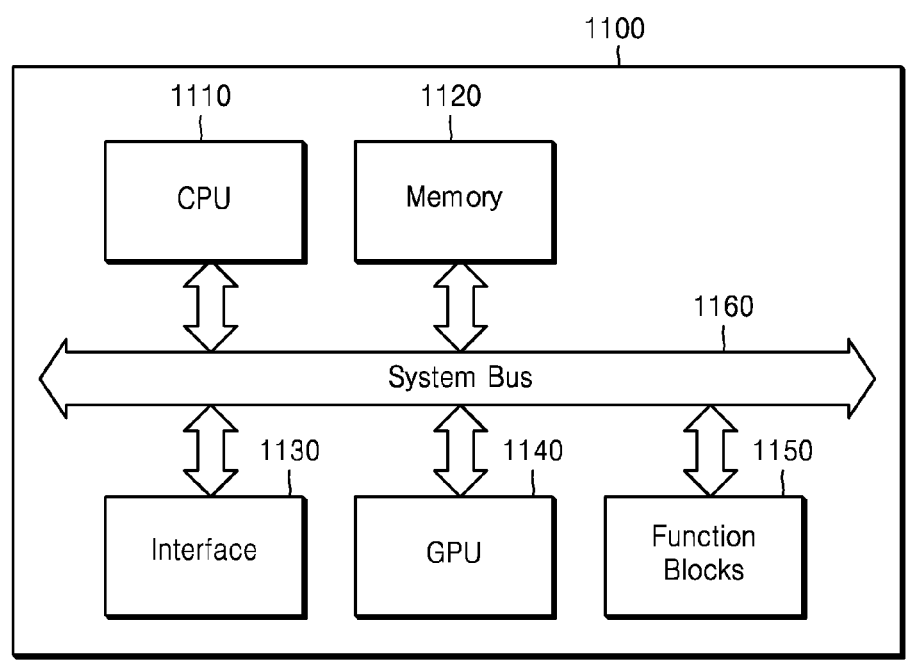
FIG. 26 is a block diagram of a stacked semiconductor package according to an embodiment of the inventive concepts.

FIG. 26 is a block diagram of a stacked semiconductor package 1100 according to an embodiment of the inventive concepts.

Referring to FIG. 26, the stacked semiconductor package 1100 includes an SoC. The stacked semiconductor package 1100 may include a CPU 1110, a memory 1120, an interface 1130, a GPU 1140, function blocks 1150, and a bus 1160. The components 1110 to 1150 may be connected to the bus 1160. The CPU 1110 may control an operation of the SoC. The CPU 1110 may include a core and an L2 cache. For example, the CPU 1110 may include multiple cores. The multiple cores may have different or same performances. The multiple cores may be activated at different timings or at the same time. The memory 1120 may store results processed by the function blocks 1150 under a control of the CPU 1110. For example, as data stored in the L2 cache of the CPU 1110 is flushed, the flushed data may be stored in the memory 1120. The interface 1130 may interface with external devices. For example, the interface 1130 may interface with a camera, an LCD, and a speaker.

The GPU 1140 may perform graphic functions that the SoC requires. For example, the GPU 1140 may perform a video codec or process 3D graphics.

The function blocks 1150 may perform a variety of functions that the SoC requires. For example, if the stacked semiconductor package 1100 is an application processor used in a mobile device, some of the function blocks 1150 may perform a communication function.

The stacked semiconductor package 1100 may be one of the stacked semiconductor packages 1, 2, 3, 4, 5, 6, 7, and 1a shown in FIGS. 1 to 25. The CPU 1110 and/or the GPU 1140 may be a main function block 142M or a function block 142 shown in FIG. 22. The memory 1120 may include the upper chips 200, 200-1, 200-2, 200-3, 200-4, 200-5, 200-6, and 200-7 shown in FIGS. 1 to 25 or at least one of the function blocks 142 of the lower chips 100, 100-1, 100-2, 100-3, 100-4, 100-5, 100-6, and 100-7. The interface 1130 and the function blocks 1150 may be used as a function block 142 shown in FIG. 22.

It is possible to dispose a high-performance main function block (e.g., a high-performance main CPU 1110 and/or a high-performance main GPU 1140) in the stacked semiconductor package 1100. Thus, the stacked semiconductor package 1100 may have relatively high performance with the same area.

Figure 27:
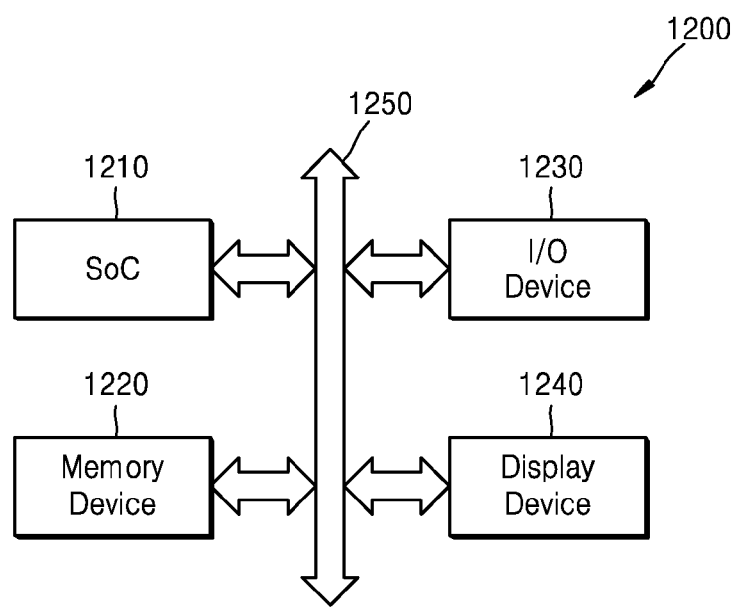
FIG. 27 is a block diagram of a stacked semiconductor package according to an embodiment of the inventive concepts.

FIG. 27 is a block diagram of a stacked semiconductor package according to an embodiment of the inventive concepts.

Referring to FIG. 27, an electronic system 1200 may include an SoC 1210. The electronic system 1200 may be, for example, a mobile device, a desktop computer, or a server. Also, the electronic system 1200 may further comprise a memory device 1220, an input/output device 1230, and a display device 1240. The components 1210 to 1240 may be connected to a bus 1250. The SoC 1210 may be one of the stacked semiconductor packages 1, 2, 3, 4, 5, 6, 7, and 1a shown in FIGS. 1 to 25 or one of the lower chips 100, 100-1, 100-2, 100-3, 100-4, 100-5, 100-6, and 100-7 shown in FIGS. 1 to 25. The memory device 1220 may include the upper chips 200, 200-1, 200-2, 200-3, 200-4, 200-5, 200-6, and 200-7 shown in FIGS. 1 to 25 or at least one of the function blocks 142 of the lower chips 100, 100-1, 100-2, 100-3, 100-4, 100-5, 100-6, and 100-7.

The electronic system 1200 may include the SoC 1210 that is suitable for placement of a main function block with relatively high performance. Thus, the electronic system 1200 may have relatively high performance.

Figure 28:
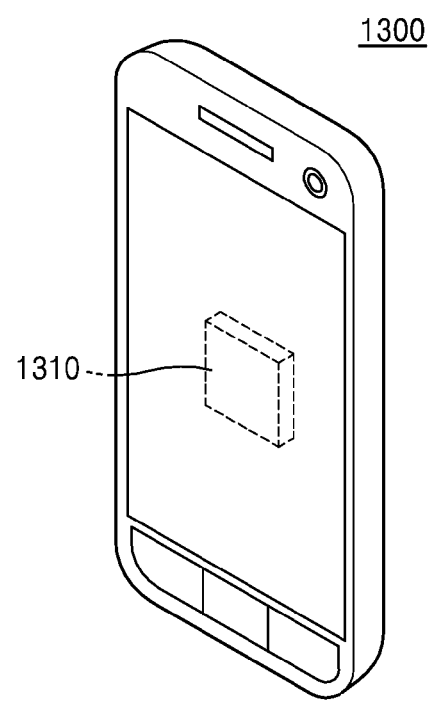
FIG. 28 is a perspective view of an electronic device including a stacked semiconductor package according to an embodiment of the inventive concepts.

FIG. 28 is a perspective view of an electronic device including a stacked semiconductor package according to an embodiment of the inventive concepts.

FIG. 28 shows an example where the electronic system 1200 shown in FIG. 27 is applied to a mobile phone 1300. The mobile phone 1300 may include an SoC 1310. The SoC 1310 may be one of the stacked semiconductor package 1, 2, 3, 4, 5, 6, 7, and 1a shown in FIGS. 1 to 25.

The mobile phone 1300 may include the SoC 1310 that is suitable for placement of a main function block with relatively high performance. Thus, the mobile phone 1300 may have relatively high performance. Also, since the SoC 1310 has relatively high performance with the same area, the size of the mobile phone 1300 may be minimized. This may mean that the mobile phone 1300 has relatively high performance.

Besides, the electronic system 1200 is applicable to a portable notebook, an MP3 player, a navigation system, a solid state disk (SSD), a vehicle, or a household appliance.

While the inventive concepts has been particularly shown and described with reference to exemplary embodiments thereof, it will be understood that various changes in form and details may be made therein without departing from the spirit and scope of the following claims.

What is claimed is:

1. A stacked semiconductor package comprising:
a lower chip having a through electrode area in which a plurality of through electrodes are disposed, said through electrode area arranged along a direction that is transverse to a longitudinal direction of an active surface of the lower chip; and
at least one upper chip stacked on the lower chip and having a pad area in which a plurality of bonding pads corresponding to the plurality of through electrodes are disposed;
wherein:
the lower chip comprises a function block area arranged apart from the through electrode area;
a plurality of function blocks are disposed in the function block area;
the active surface of the lower chip has a first length measured in the longitudinal direction and a second length measured in a transverse direction;
the first length is greater than the second length;
the through electrode area extends in the transverse direction of the active surface of the lower chip and has a first width measured in the longitudinal direction; and
a length of each edge of at least one of the plurality of function blocks is longer than or equal to half of a difference between the first length and the first width.

2. The stacked semiconductor package of claim 1, wherein the pad area is disposed along a central axis of the upper chip in a longitudinal direction.

3. The stacked semiconductor package of claim 1, wherein the function block area is one of first and second function block areas of the lower chip spaced apart from each other with the through electrode area disposed therebetween.

4. The stacked semiconductor package of claim 3, wherein the first functional block area comprises a graphics processing unit (GPU) and the second functional block area comprises a central processing unit (CPU).

5. The stacked semiconductor package of claim 1, wherein the lower chip includes a microprocessor and the upper chip includes a memory device.

6. The stacked semiconductor package of claim 5, wherein the memory device is a dynamic random access memory (DRAM).

7. The stacked semiconductor package of claim 1, wherein an edge region on a longitudinal side of the active surface of the at least one upper chip extends beyond an edge of the lower chip on a transverse side.

8. The stacked semiconductor package of claim 1, wherein an edge region on a transverse side of the active surface of the at least one upper chip extends beyond an edge of the lower chip.

9. The stacked semiconductor package of claim 1, wherein opposite edges in a longitudinal direction of the active surface of the upper chip extend beyond respective edges of the lower chip.

10. The stacked semiconductor package of claim 1, wherein the pad area of the upper chip is disposed adjacent to an edge of the upper chip on a transverse side.

11. The stacked semiconductor package of claim 1, wherein all through electrodes of the lower chip are disposed substantially along a central axis in the transverse direction.

12. A stacked semiconductor package comprising:
a lower chip; and
an upper chip stacked on the lower chip,
wherein the lower chip comprises:
a through electrode area having a first width such that a plurality of through electrodes are disposed along a central axis arranged in a transverse direction of an active surface of the lower chip; and
a function block area that is arranged apart from the through electrode area and in which a plurality of function blocks are disposed,
wherein the upper chip comprises:
a pad area disposed along a central axis arranged in a longitudinal direction of the active surface of the upper chip, said pad area having a plurality of pads corresponding to the plurality of through electrodes disposed therein,
wherein the active surface of the lower chip has a first length measured in a longitudinal direction and a second length measured in a transverse direction,
wherein a third length measured in the longitudinal direction of the active surface of the upper chip is longer than the second length,
wherein the first length is greater than the second length, and
wherein each edge of the function block area has a length that is longer than or equal to half of a difference between the first length and the first width.

13. The stacked semiconductor package of claim 12, wherein the third length is shorter than the first length.

14. A stacked semiconductor package comprising:
a lower chip having a first through electrode area in which a plurality of through electrodes are disposed, the lower chip having a function block area arranged apart from the first through electrode area and in which a plurality of function blocks are disposed; and
at least one upper chip stacked on the lower chip, said upper chip having a pad area in which a plurality of pads corresponding to the plurality of through electrodes are arranged,
wherein the pad area is disposed along a central axis of the upper chip,
wherein an active surface of the lower chip has a first length measured in a longitudinal direction and a second length measured in a transverse direction,
wherein the first through electrode area extends in the transverse direction, is disposed on a longitudinal side of the lower chip, and has a first width measured in a longitudinal direction,
wherein the first length is greater than the second length, and
wherein each edge of the function block area has a length that is longer than or equal to half of a difference between the first length and the first width.

15. The stacked semiconductor package of claim 14, wherein the second length is shorter than a difference between the first length and the first width.

16. The stacked semiconductor package of claim 15, wherein at least one edge of the function block area has an edge length equal to or shorter than the second length.

17. The stacked semiconductor package of claim 14, wherein the lower chip further comprises a second through electrode area, the first and second through electrode area disposed adjacent to opposite edges of the active surface of the lower chip, and
wherein the at least one upper chip comprises at least two upper chips each stacked on a respective one of the first and second through electrode areas.

18. The stacked semiconductor package of claim 17, wherein a portion of an inner edge region on a transverse side of the active surface of each of the at least two upper chips is disposed on the active surface of the lower chip, and wherein an outer edge region thereof opposite to the inner edge region is disposed outside of an edge of the lower chip.

* * * * *